United States Patent
Rose et al.

(10) Patent No.: US 11,036,008 B2
(45) Date of Patent: Jun. 15, 2021

(54) EMPLOYING DEPOLARIZER ARRANGEMENTS TO MITIGATE INTERFERENCE IN AN OPTICAL LINK DUE TO VIBRATION AND CURRENT EFFECTS

(71) Applicant: General Electric Technology GmbH, Baden (CH)

(72) Inventors: Allen Howard Rose, Cave Creek, AZ (US); Fahmida Ferdous, Phoenix, AZ (US)

(73) Assignee: General Electric Technology GmbH, Baden (CH)

( * ) Notice: Subject to any disclaimer, the term of this patent is extended or adjusted under 35 U.S.C. 154(b) by 172 days.

(21) Appl. No.: 16/288,061

(22) Filed: Feb. 27, 2019

(65) Prior Publication Data

US 2020/0271863 A1    Aug. 27, 2020

(51) Int. Cl.
G02B 6/27 (2006.01)
G01R 15/24 (2006.01)
G01R 19/00 (2006.01)

(52) U.S. Cl.
CPC ......... *G02B 6/2786* (2013.01); *G01R 15/246* (2013.01); *G01R 19/00* (2013.01); *G02B 6/2766* (2013.01); *G01R 15/242* (2013.01)

(58) Field of Classification Search
None
See application file for complete search history.

(56) References Cited

U.S. PATENT DOCUMENTS

| 7,282,697 | B2 | 10/2007 | Thomas et al. |
| 9,389,248 | B2 * | 7/2016 | Sasaki .............. G01D 5/35322 |
| 2002/0122183 | A1 | 9/2002 | Ohno et al. |
| 2011/0115469 | A1 | 5/2011 | Kondo et al. |

OTHER PUBLICATIONS

A. H. Rose, and J. N. Blake, "Free Form Factor Optical Current Sensor for AC and DC Commercial Power Applications," Proc. 18th International Conference on Optical Fiber Sensors, Cancun, Mexico, Oct. 1-4, 2006.

(Continued)

*Primary Examiner* — Chad H Smith
(74) *Attorney, Agent, or Firm* — Eversheds Sutherland (US) LLP

(57) ABSTRACT

Techniques for reducing interference with sensor (light) signals and measurement in polarimetric fiber optic sensors from undesired effects of current and vibrations on light signals carried in fiber optic cables are presented. A sensor system comprises a first depolarizer associated with a fiber optic cable and in proximity to a light source that provides a light signal to such cable. First depolarizer depolarizes the light signal to produce a first depolarized light signal output to another portion of the fiber optic cable that can be wrapped around or associated with a conductor cable or ground cable. To reduce undesired polarizing effects on the first depolarized light signal due to current or vibrations from the conductor cable or ground cable, the system comprises a second depolarizer that depolarizes the (re) polarized light signal to produce a second depolarized light signal suitable for use in sensing current or voltage after additional processing.

19 Claims, 9 Drawing Sheets

(56) References Cited

OTHER PUBLICATIONS

Rose et al., "Optical Fiber Current and Voltage Sensors for the Electric Power Industry", chapter 27, Handbook of Optical Fibre Sensing Technology, ed. Jose Miguel Lopez-Higuera, Wiley & Sons, Ltd., West Sussex, England, 569-618 (2002).
Blake et al., "In-Line Sagnac Interferometer Current Sensor", IEEE Transactions on Power Delivery, vol. 11, No. 1, Jan. 1996, pp. 116-121.
Short et al., "Imperfect Quarter-Waveplate compensation in Sagnac Interferometer-Type Current Sensors", J. Lightwave Technol., vol. 16, 1212-1219 (1998).
Blake, James., "Current Sensors based on the Sagnac Interferometer", Proc. SPIE, vol. 2837, 1996, pp. 166-171.
Binu rt al., "Fibre optic displacement sensor for the measurement of amplitude and frequency of vibration", Optics & Laser Technology 39 (2007) pp. 1537-1543.
European Search Report dated Oct. 14, 2020 for Euopean Patent Application 20170592.8 (8 pages).

* cited by examiner

EMPLOYING DEPOLARIZER ARRANGEMENTS TO MITIGATE INTERFERENCE IN AN OPTICAL LINK DUE TO VIBRATION AND CURRENT EFFECTS

BACKGROUND

Various types of sensors can be employed for a variety of purposes. For example, sensors can be utilized to sense electrical current or voltage levels at various points (e.g., a power transmission line) in an electrical system. Some sensors, such as polarimetric or interferometric sensors, can comprise fiber optic cables that can transmit or carry a light signal to a sensor head, which can include a sensing element (e.g., a particular sensing fiber) and other components, wherein the sensor head can be placed on or in proximity to the point in the electrical system being checked. The current at the point being sensed can affect and change the light signal as the light signal propagates through the sensor head, wherein such change of the light signal can indicate the current level. The change in the light signal can be detected and measured by the sensor component, wherein the sensor component detects or measures the current level based on the change in the light signal.

The above-described background is merely intended to provide a contextual overview of optical sensors, and is not intended to be exhaustive.

SUMMARY

The following presents a simplified summary of various aspects of this disclosure in order to provide a basic understanding of such aspects. This summary is not an extensive overview of all contemplated aspects, and is intended to neither identify key or critical elements nor delineate the scope of such aspects. Its purpose is to present some concepts of this disclosure in a simplified form as a prelude to the more detailed description that is presented later.

The disclosed subject matter can include a system that can comprise a first depolarizer component that is associated with a first portion of an optical cable that is in proximity to a light source component that provides a light signal to the optical cable, wherein the first depolarizer component depolarizes the light signal to generate a first depolarized light signal that is transmitted via a second portion of the optical cable, and wherein, during the transmission of the first depolarized light signal via the second portion of the optical cable, the first depolarized light signal is polarized to generate a modified light signal. The system also can include a second depolarizer component that is associated with a third portion of the optical cable in proximity to a sensor head component of a sensor component, wherein the second depolarizer component receives the modified light signal from the second portion of the optical cable and depolarizes the modified light signal to generate a second depolarized light signal.

The disclosed subject matter also can include a method, comprising first depolarizing, by a first depolarizer, a light signal to produce a first depolarized light signal, wherein the first depolarizer is associated with a first portion of a fiber optic cable that is within a first distance of a light source device that generates the light signal. The method also can include transmitting the first depolarized light signal via a second portion of the fiber optic cable, wherein the first depolarized light signal is polarized, based on at least one polarizing effect associated with the second portion of the fiber optic cable, to produce an altered light signal. The method further can comprise second depolarizing, by a second depolarizer, the altered light signal to produce a second depolarized light signal, wherein the second depolarizer receives the altered light signal and is associated with a third portion of the fiber optic cable that is within a second distance of a sensor head unit of a sensor device.

The disclosed subject matter further can comprise a device that can comprise a first depolarizer component that is associated with a first portion of a fiber optic cable that is within a first distance of a light source component that emits a light signal to the first portion of the fiber optic cable, wherein the first depolarizer component depolarizes the light signal to produce a first depolarized light signal that is transmitted via a second portion of the fiber optic cable, and wherein, during the transmission of the first depolarized light signal via the second portion of the fiber optic cable, the first depolarized light signal is polarized, based on at least one polarizing effect associated with the second portion of the fiber optic cable, to produce an altered light signal. The device also can comprise a second depolarizer component that is associated with a third portion of the fiber optic cable that is within a second distance of a sensor head unit of a sensor component, wherein the second depolarizer component receives the altered light signal from the second portion of the fiber optic cable and depolarizes the altered light signal to produce a second depolarized light signal.

The following description and the annexed drawings set forth in detail certain illustrative aspects of this disclosure. These aspects are indicative, however, of but a few of the various ways in which the principles of this disclosure may be employed. This disclosure is intended to include all such aspects and their equivalents. Other advantages and distinctive features of this disclosure will become apparent from the following detailed description of this disclosure when considered in conjunction with the drawings.

DETAILED DESCRIPTION

Figure 1:
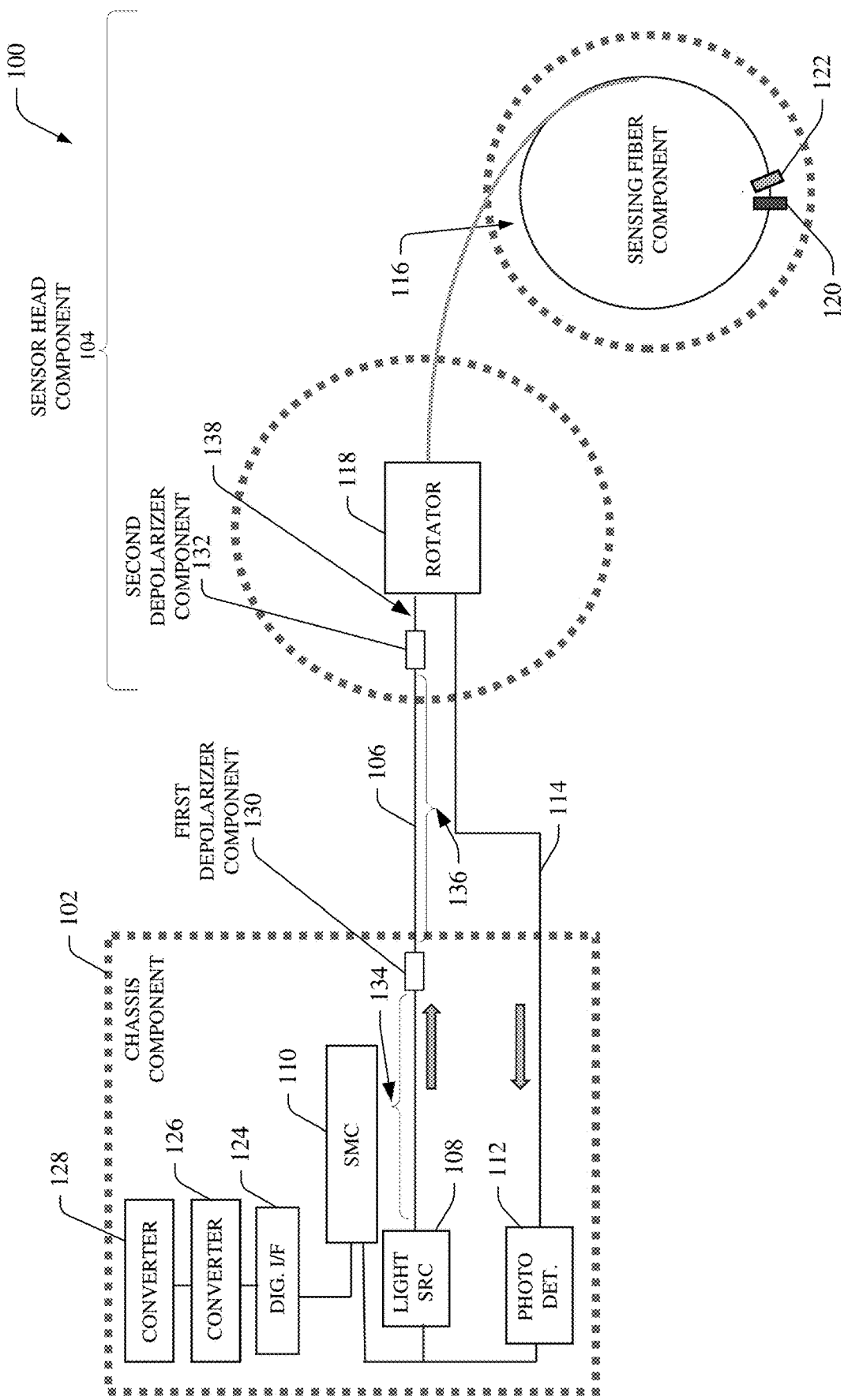
FIG. 1 is a block diagram of an example system that can employ a depolarizer arrangement to facilitate reducing interference with sensor signals (e.g., light signals comprising sensor information) and measurement in fiber optic sensors from undesired effects of current or vibrations on light signals carried in fiber optic cables, in accordance with various aspects and embodiments of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the various embodiments of the subject disclosure. It may be evident, however, that the disclosed subject matter may be practiced without these specific details. In other instances, well-known structures and devices are shown in block diagram form in order to facilitate describing the various embodiments herein.

Various types of sensors can be employed for a variety of purposes. For example, sensors can be utilized to sense electrical current or voltage levels at various points (e.g., a power transmission line) in an electrical system. Some sensors, such as polarimetric sensors, can comprise fiber optic cable that can transmit or carry a light signal to a sensor head, which can include a sensing element (e.g., a particular sensing fiber) and other components, wherein the sensor head can be placed on or in proximity to the point (e.g., power line or other component) in the electrical system being checked. The current or voltage at the point being sensed can affect and change the light signal as the light signal propagates through the sensor head, wherein such change of the light signal can indicate the current level or voltage level. The change in the light signal can be detected and measured by the sensor component, wherein the sensor component detects or measures the current level or voltage level based on the change in the light signal.

In some instances, it can be desirable to check and measure the current or voltage at a remote location of the electrical power system, which can be located a significant distance away (e.g., 1 kilometer (km), 5 km, 10 km, 20 km, or other desired distance less than or greater than 20 km) from a chassis component (e.g., an electronic chassis) where the light source component, which can provide the light signal to the fiber optic cable, photodetector component, which can detect light signals, including light characteristics or sensor information in light signals, and certain other sensor system components can be located. To facilitate the sensing of current or voltage at the remote location, a long fiber optic cable (e.g., up to 20 km or more) can be run from the chassis component to the sensor head component, where the current or voltage sensing can be performed.

While it may be possible to use conduit to carry the fiber optic cable (e.g., carry the fiber optic cable underground) from the chassis component to the sensor head component, this can be an undesirably expensive approach. The disclosed subject matter can instead run the fiber optic cable along with, and associate the fiber optic cable with, an electrical conductor cable or a ground wire of the electrical power system, wherein, for example, the fiber optic cable can be wrapped around, attached to, integrated with, or otherwise associated with the electrical conductor cable or ground wire. Associating the fiber optic cable with an electrical conductor cable or a ground wire can be significantly less expensive than carrying the fiber optic cable in conduit. However, associating the fiber optic cable with an electrical conductor cable or a ground wire can subject the fiber optic cable and the light signal carried therein to various undesired and negative effects, including Faraday effects, vibrational effects, or other optical-related effects (e.g., effects that can cause an alteration of light characteristics of a light signal), which can interfere with the sensing of electrical current or voltage at a desired point (e.g., power line or other component) of the electrical power system by the sensor head component and can result in undesirable and significant error in the current or voltage measurements. When a fiber optic cable is associated with an electrical conductor cable, there can be Faraday effects, vibrational effects, or other optical-related effects due to the current flowing through the electrical conductor cable or other vibrational effects from environmental conditions (e.g., wind, seismic activity, . . . ), as more fully described herein. When a fiber optic cable is associated with a ground wire, there can be vibrational effects or other optical-related effects due to environmental conditions (e.g., wind, seismic activity, . . . ), as more fully described herein.

The disclosed subject matter can comprise a sensor system that can employ depolarizer arrangements that can reduce (e.g., mitigate, minimize, or eliminate) Faraday effects, vibrational effects, or other optical-related effects that can be associated with the fiber optic cable and light signal carried therein as a result of the fiber optic cable being associated with the electrical conductor wire or ground wire, or as a result of polarization associated with the chassis component (e.g., associated with the drive/control unit of the chassis component). The sensor system can comprise a first depolarizer component that can be placed in proximity to the light source component (e.g., in the chassis component) and can be associated with (e.g., connected to or integrated with) the fiber optic cable. The sensor system also can include a second depolarizer component that can be placed in proximity to a rotator component in the sensor head component, wherein the second depolarizer can be associated with (e.g., connected to or integrated with) the section of the fiber optic cable at the sensor head component.

The first depolarizer component can depolarize the light signal to generate a first depolarized light signal, wherein the depolarizing of the light signal can reduce the degree of polarization of the light signal carried in the fiber optic cable due to polarizing effects associated with the chassis component (e.g., associated with the drive/control unit of the chassis component). The first depolarized light signal output from the first depolarizer component can be transmitted via another portion (e.g., second portion) of the fiber optic cable, wherein such portion of the fiber optic cable can be associated with (e.g., wrapped around, attached to, or integrated with) an electrical conductor cable or ground wire of the electrical power system. As described herein, there can be undesirable Faraday effects, vibrational effects, or other optical-related effects that can stem from associating the fiber optic cable with the electrical conductor cable or ground wire. As the first depolarized light signal is transmitted via the other (e.g., second) portion of the fiber optic cable, the first depolarized light signal can be altered (e.g., (re)polarized) to produce an altered light signal, due to Faraday effects, vibrational effects, or other optical-related effects associated with the other portion of the fiber optic cable as a result of associating such other portion of the fiber optic cable with the electrical conductor cable or ground wire.

The second depolarizer component can be associated with (e.g., connected to or integrated with an end of that portion of the fiber optic cable, and can receive the altered light signal from that portion of the fiber optic cable. The second depolarizer component can depolarize the altered light signal to generate a desirably depolarized light signal that can be output to another portion of the fiber optic cable to the rotator component of the sensor head component. The light signal (e.g., second depolarized light signal) can be in a desired condition for further processing by the rotator component, a sensing fiber component, a quarter waveplate component, and a mirror component, as more fully described herein. As the light signal is carried through the sensing fiber component, the light signal can be changed, for example, due to a Faraday effect associated with the electrical current being sensed from the desired component (e.g., power line) by the sensing fiber component, and the mirror component can redirect or reflect the light signal (as changed due to the sensing by the sensing fiber component) through the return fiber optic cable to the photodetector component in the chassis component. The photodetector component, sensor management component, or other sensor system components in the chassis component can analyze the received (e.g., returned) light signal and can detect sensor information in the light signal (e.g., due to the change to the light signal at the sensing fiber component) to measure the electrical current or voltage at the desired component (e.g., power line) of the electrical power system, as more fully described herein.

The depolarization arrangements of the disclosed subject matter can enable the sensor system (e.g., the sensing fiber component of the sensor system) to desirably and accurately sense and measure the amount of current or voltage at the desired component (e.g., the power line) of the electrical power system, as such depolarization arrangements can be utilized to reduce (e.g., mitigate, minimize, or eliminate) the undesired polarization of light signals, due to the Faraday effects, vibrational effects, or other optical-related effects from the second portion of the fiber optic cable being associated with the electrical conductor cable or ground wire, or the undesired polarization of light signals due to polarization effects associated with the chassis component. This can reduce (e.g., mitigate, minimize, or eliminate) the amount of error in the sensing and measurement of the electrical current or voltage at the desired component (e.g., the power line) of the electrical power system.

These and other aspects and embodiments of the disclosed subject matter will now be described with respect to the drawings.

Referring to the drawings, FIG. 1 is a block diagram of an example system 100 that can employ a depolarizer arrangement to facilitate reducing interference with sensor signals (e.g., light signals comprising sensor information) and measurement in fiber optic sensors from undesired effects of current or vibrations on light signals carried in fiber optic cables, in accordance with various aspects and embodiments of the disclosed subject matter. The system 100 (e.g., sensor system) can comprise a sensor (e.g., a fiber optic sensor) that can be utilized to sense or measure an electrical current, a voltage, or power, or to detect cable faults (e.g., fault in an electrical transmission cable), for example, at a desired point (e.g., location) of an electrical power system. The desired point can be, for example, an electrical component (e.g., power line) or electrical subsystem of the electrical power system. In some embodiments, the sensor can be a polarimetric or interferometric fiber optic sensor (e.g., a fiber optic sensor comprising a polarimetric or interferometric element). For example, the polarimetric or interferometric fiber optic sensor can be a current (e.g., Faraday effect) sensor or a voltage (e.g., Pockels cell) sensor. In certain embodiments, the fiber optic sensor can be or can comprise an inline Sagnac interferometer, although in other embodiments, another type of interferometer can be utilized in the system 100.

The system 100 can comprise a chassis component 102 that can include various components (e.g., electronic components, hardware components, or software components, . . . ) that can form a control/drive unit of the sensor. The system 100 also can comprise a sensor head component 104 that can include the head (e.g., sensing portion or head) of the sensor and other components, as more fully described herein. The system 100 can include a fiber optic cable 106 (e.g., optical cable) that can extend from the chassis component 102 to the sensor head component 104 and can connect (e.g., via a fiber optic connection) the chassis component 102 to the sensor head component 104. In some embodiments, the sensor head component 104 can be a significant distance (e.g., 1 kilometer (km), 5 km, 10 km, 20 km, or other desired distance less than or greater than 20 km) away from the chassis component 102 to enable and facilitate remote sensing of current, voltage, or power at a desired point (e.g., power line) of the electrical power system where the sensor head component 104 is located. In accordance with various embodiments, the sensor head component 104 can be associated with (e.g., can be contained in or otherwise associated with) a high voltage (HV) column, which can be a type of mechanical assembly that can be associated with a high voltage power line, or the sensor head component 104 can be associated with a mechanical assembly that can be associated with a lower voltage power cable. The fiber optic cable 106 can have a length that can correspond to (e.g., a length that can be same as or greater than) the distance between the chassis component 102 and the sensor head component 104. For instance, if the sensor head component 104 is located 10 km away from the chassis component 102, the fiber optic cable 106 (e.g., the forward fiber optic link) can be 10 km or more in length, spanning from the chassis component 102 to the sensor head component 104. In some embodiments, the fiber optic cable 106 can be single-mode fiber optic cable.

In some instances, it can be desired to run the fiber optic cable 106 along with, and associate the fiber optic cable 106 with, an electrical conductor cable (e.g., power transmission cable) or a ground wire of the electrical power system, for example, as a cost saving measure. While it may be possible to use conduit to carry fiber optic cable (e.g., carry fiber optic cable underground) from the chassis component to the sensor head component, this can be an undesirably expensive approach. The disclosed subject matter can instead run the fiber optic cable 106 along with, and associate the fiber optic cable 106 with, the electrical conductor cable or ground wire, wherein, for example, the fiber optic cable 106 can be wrapped around, attached to, integrated with, or otherwise associated with the electrical conductor cable or ground wire. Associating the fiber optic cable 106 with an electrical conductor cable or a ground wire can be significantly less expensive than carrying the fiber optic cable 106 in conduit.

Figure 2:
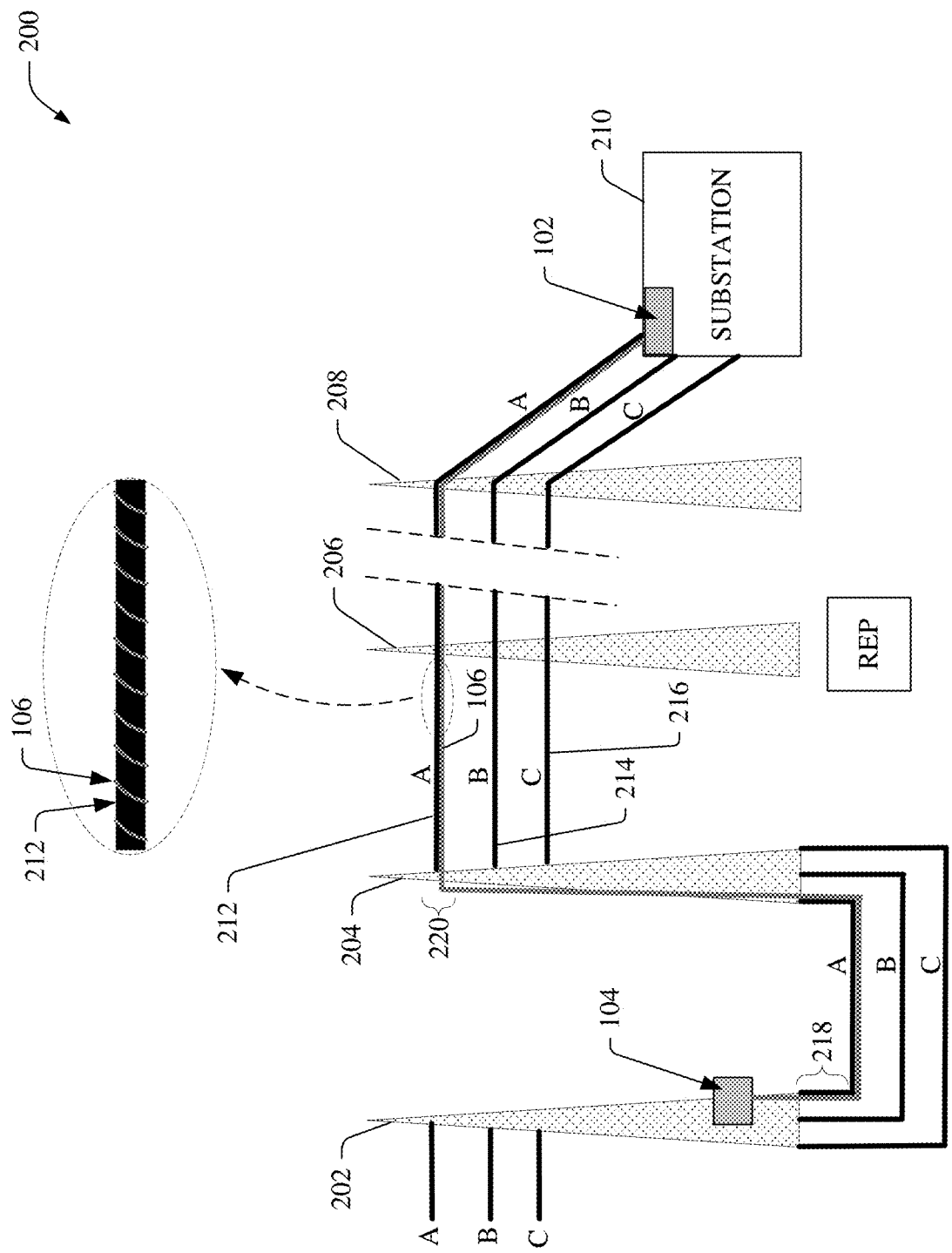
FIG. 2 depicts a diagram of an example system that can include a sensor system that can employ a depolarizer arrangement to facilitate reducing interference with sensor signals (e.g., light signals comprising sensor information) and measurement in fiber optic sensors from undesired effects of current or vibrations on light signals carried in fiber optic cables that are associated with (e.g., wrapped around) an electrical conductor cable, in accordance with various aspects and embodiments of the disclosed subject matter.
Figure 3:
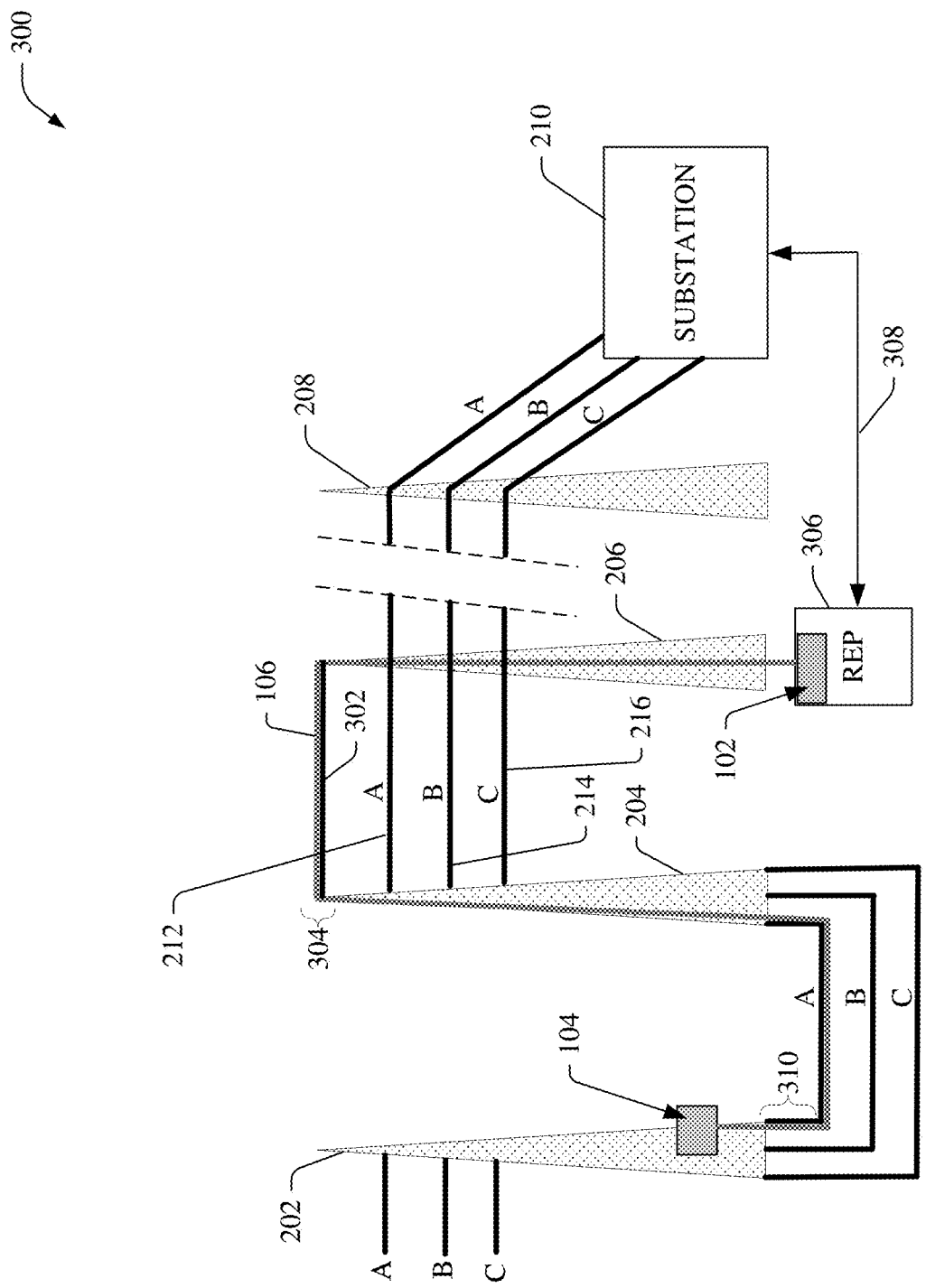
FIG. 3 illustrates a diagram of an example system that can include a sensor system that can employ a depolarizer arrangement to facilitate reducing interference with sensor signals (e.g., light signals comprising sensor information) and measurement in fiber optic sensors from undesired effects of vibrations on light signals carried in fiber optic cables that are associated with (e.g., wrapped around, integrated with, or attached to) a ground wire, in accordance with various aspects and embodiments of the disclosed subject matter.

Referring to FIGS. 2 and 3 (along with FIG. 1), FIG. 2 depicts a diagram of an example system 200 that can include a sensor system (e.g., system 100) that can employ a depolarizer arrangement to facilitate reducing interference with sensor signals (e.g., light signals comprising sensor information) and measurement in fiber optic sensors from undesired effects of current or vibrations on light signals carried in fiber optic cables that are associated with (e.g., wrapped around) an electrical conductor cable, in accordance with various aspects and embodiments of the disclosed subject matter. FIG. 3 illustrates a diagram of an example system 300 that can include a sensor system (e.g., system 100) that can employ a depolarizer arrangement to facilitate reducing interference with sensor signals (e.g., light signals comprising sensor information) and measurement in fiber optic sensors from undesired effects of vibrations on light signals carried in fiber optic cables that are associated with (e.g., wrapped around) a ground wire, in accordance with various aspects and embodiments of the disclosed subject matter.

With regard to the system 200 of FIG. 2, the system 200 can comprise an electrical power system, a portion of which is presented in FIG. 2, wherein the electrical power system can include a set of towers (e.g., high voltage (HV) towers), including tower 202, tower 204, tower 206, and tower 208, that can be located at desired distances (e.g., 0.5 km, 0.7 km, 1.0 km, or other desired distance) from each other. The system 200 also can include a power substation 210 that can be a desired distance away from the tower 208. The system 200 can provide electrical power, which can be 3-phase power, via a set of electrical conductor cables, including electrical conductor cable 212 for phase A, electrical conductor cable 214 for phase B, and electrical conductor cable 216 for phase C, that can be associated with (e.g., connected or attached to) the towers (e.g., 202, 204, 206, 208) and the power substation 210, and can run from tower to tower (e.g., from tower 202 to tower 204 to tower 206 to tower 208) and to the power substation 210. The system 200 also can include a ground wire (not shown in FIG. 2) that can be associated with (e.g., connected or attached to) the towers (e.g., 202, 204, 206, 208) and the power substation 210, and can run from tower to tower (e.g., from tower 202 to tower 204 to tower 206 to tower 208) and to the power substation 210. In accordance with various embodiments, a portion of the electrical conductor cables (e.g., 212, 214, 216) (or the ground wire) can be run underground (as depicted at reference numeral 218), and another portion of the electrical conductor cables (e.g., 212, 214, 216) (or the ground wire) can be run above ground (as depicted at reference numeral 220).

The system 200 can comprise the sensor system (e.g., the sensor system 100 of FIG. 1), which can include the chassis component 102, the sensor head component 104, and the fiber optic cable 106. The chassis component 102 can be located at or associated with (e.g., attached to or placed in) the substation 210, and the sensor head component 104 can be located at and associated with (e.g., attached to or placed in) the tower 202, wherein the tower 202 can be a desired distance (e.g., 1 km, 5 km, 10 km, 20 km, or other desired distance less than or greater than 20 km) away from the substation 210. The sensor system 100 can be employed to facilitate sensing and measuring electrical current, voltage, or power at a remote location (e.g., a desired point, such as a power line of or associated with the tower 202) or to facilitate detecting cable faults (e.g., a fault in an electrical conductor cable). In some embodiments, the fiber optic cable 106 can be run from the chassis component 102 at the power substation 210 to the tower 202 across the other towers (e.g., 204, 206, 208) in between, and can be associated with an electrical conductor cable, such as, for example, electrical conductor cable 212 for phase A, although in other embodiments, the fiber optic cable 106 can be associated with another electrical conductor cable (e.g., 214 or 216). For example, the fiber optic cable 106 can be wrapped around the electrical conductor cable 212 (as depicted in FIG. 2), attached to the electrical conductor cable 212, or otherwise associated with the electrical conductor cable 212. As the fiber optic cable 106 can be associated with, and can run along with, the electrical conductor cable 212, a portion of the fiber optic cable 106 can be run underground with the electrical conductor cable 212 (as depicted at reference numeral 218), and another portion of the fiber optic cable 106 can be run above ground (as depicted at reference numeral 220).

Associating the fiber optic cable 106 with (e.g., wrapping the fiber optic cable 106 around) the electrical conductor cable 212 can present certain problems with regard to sensing electrical currents at a desired point (e.g., a remote point, such as the tower 202). As more fully described herein, the sensor head component 104 can process (e.g., polarize, phase shift, etc., in a controlled manner) a light signal transmitted via the fiber optic cable 106 from the chassis component 102 to the sensor head component 104 and can utilize such desirably processed light signal to facilitate sensing electrical current at the desired point, wherein the electrical current can produce a Faraday effect that can be sensed by the sensor head component 104 (e.g., sensing fiber component of the sensor head component) and can produce a change (e.g., change in characteristics) in the desirably processed light signal that can be detected and measured to correspondingly measure the electrical current at the desired point. However, there is electrical current being carried in the electrical conductor cable 212 with which the fiber optic cable 106 is associated (e.g., around which the fiber optic cable 106 is wrapped). The electrical current in the electrical conductor cable 212 can produce an undesired Faraday effect or other undesired optical-related effects (e.g., effects that can cause an alteration of light characteristics of a light signal) in the fiber optic cable 106 and the light signal being carried by the fiber optic cable from the chassis component 102 to the sensor head component 104. For instance, the light signal being carried in the fiber optic cable 106 can be undesirably polarized due to polarization dependent loss in the cable and undesirably changed by the Faraday effect or can be undesirably changed due to other undesired optical-related effects from the electrical conductor cable 212 being associated with the fiber optic cable 106 and the light signal.

Also, the electrical current being carried in the electrical conductor cable 212 can produce vibrations (e.g., vibrations at a particular frequency, such as 60 Hertz (Hz) or 50 Hz) from the alternating current (AC) signal being carried in the electrical conductor cable 212, and such vibrational effect can undesirably impact (e.g., undesirably change the polarization state of the light) the fiber optic cable 106 and light signal carried therein. For example, the light signal being carried in the fiber optic cable 106 can have the polarization state of the light and the power level of the light undesirably changed (e.g., altered) due to the undesired vibrational effects from the electrical current of the electrical conductor cable 212 impacting the fiber optic cable 106 and the light signal. Further, the electrical conductor cable 212 and the fiber optic cable 106 can be subject to other undesired vibrational effects due to environmental conditions in the areas where the electrical conductor cable 212 and the fiber optic cable 106 are located. For instance, with regard to the portion of the cables (e.g., 106, 212) that are above ground, winds can cause the cables (e.g., 106, 212) to vibrate, animals on the cables (e.g., 106, 212) can cause the cables to vibrate, or earthquakes, volcanoes, or other seismic activity can cause the cables (e.g., 106, 212) to vibrate. Also, with regard to the portion of the cables (e.g., 106, 212) that are underground, earthquakes, volcanoes, or other seismic activity can cause the cables (e.g., 106, 212) to vibrate. These undesired vibrational effects due to environmental conditions can cause the light signal being carried in the fiber optic cable 106 to be undesirably affected. For example, the polarization state of the light and the power level of the light can be undesirably changed (e.g., altered) due to the undesired vibrational effects from the environmental conditions impacting the fiber optic cable 106 and the light signal carried therein.

As more fully described herein, the disclosed subject matter (e.g., employing the sensor system 100 of FIG. 1) can utilize a desirable depolarizer arrangement that can reduce or mitigate the amount of interference (e.g., undesired polarization) of undesired Faraday effects, vibrational effects, or other optical-related effects on the fiber optic cable 106 and the light signal carried therein.

Turning briefly to FIG. 3, the system 300 can comprise a set of towers (e.g., HV towers), including towers 202, 204, 206, and 208, the power substation 210, a set of electrical conductor cables, including electrical conductor cables 212, 214, and 216, such as described herein with regard to the system 200 of FIG. 2. The system 300 also can comprise a ground wire 302 that can be associated with (e.g., attached or connected to) the towers 202, 204, 206, and 208, and the power substation 210, wherein at least a portion of the ground wire 302 can be run above ground, for example, from tower 204 to tower 206 (as depicted at reference numeral 304).

In some embodiments, at least a portion of the fiber optic cable 106 can be associated with the ground wire 302. For instance, the fiber optic cable 106 can be run from the chassis component 102 associated with a remote electronics platform (REP) 306 to the sensor head component 104, which can be located at a desired point, such as the tower 202, where sensing of electrical current, voltage, or power can be desired, wherein the REP 306 can be associated with or in proximity to the tower 206. The REP 306 can comprise various equipment and electronics, including the chassis component 102. The REP 306 (and chassis component 102) can be associated with (e.g., communicatively connected to) the power substation 210 via a communication link 308, wherein information (e.g., sensor information, such as current measurements) can be communicated between the REP 306 (and chassis component 102) and the power substation 210 via the communication link 308. In some embodiments, the REP 306 and the communication link 308 can be buried underground, although in other embodiments, the REP 306 can be placed above ground.

The sensor system 100 can be employed to facilitate sensing and measuring electrical current, voltage, or power at a remote location (e.g., a desired point, such as the tower 202) or to facilitate detecting cable faults (e.g., a fault in an electrical conductor cable). In some embodiments, a portion of the fiber optic cable 106 can be run above ground and can be associated with (e.g., wrapped around, attached to, or integrated with) the ground wire 302 (as depicted at reference numeral 304). For instance, if the ground wire 302 has a hollow wire structure, the fiber optic cable 106 can be inserted or contained in the hollow region of the ground wire 302. If the ground wire 302 does not have such a hollow wire structure, the fiber optic cable 106 can be wrapped around or attached to the ground wire 302. Another portion of the fiber optic cable 106 can be run underground along with, or can be associated with, an electrical conductor cable (e.g., 212) (as depicted at reference numeral 310). For instance, from the tower 202, the electrical conductor cable (e.g., 212) and the fiber optic cable 106 can be underground, and at tower 204, the electrical conductor cable (e.g., 212) and the fiber optic cable 106 can be transitioned above ground, wherein from that point the fiber optic cable 106 can be associated with the ground wire 302.

With regard to associating the fiber optic cable 106 to the ground wire 302, the ground wire 302 and the fiber optic cable 106 can be subject to undesired vibrational effects due to environmental conditions in the areas where the ground wire 302 and fiber optic cable 106 are located. For instance, with regard to the portion of the ground wire 302 and fiber optic cable 106 that are above ground, winds can cause the ground wire 302 and fiber optic cable 106 to vibrate, animals on the ground wire 302 and fiber optic cable 106 can cause them to vibrate, or earthquakes, volcanoes, or other seismic activity can cause the ground wire 302 and fiber optic cable 106 to vibrate. These undesired vibrational effects due to environmental conditions can affect (e.g., negatively affect) the fiber optic cable 106 and the light signal carried therein. For example, the polarization state and the power level of the light signal being carried in the fiber optic cable 106 can be undesirably changed due to the undesired vibrational effects from the environmental conditions impacting the fiber optic cable 106 and the light signal carried therein.

With regard to the portion of the fiber optic cable 106 being run underground, the problems (e.g., undesired vibrational effects, undesired Faraday effects, or other undesired optical-related effects) that the fiber optic cable 106 can be subject to when run underground or associated with an electrical conductor cable (e.g., 212) can be the same as those described herein. As more fully described herein, the disclosed subject matter (e.g., employing the sensor system 100 of FIG. 1) can utilize a desirable depolarizer arrangement that can reduce or mitigate the amount of interference (e.g., undesired polarization) of undesired vibrational effects, Faraday effects, or other optical-related effects, on the fiber optic cable 106 and the light signal carried therein.

With further regard to the sensor system 100 of FIG. 1, the system 100 can comprise a light source component 108 (LIGHT SRC) that can be associated with (e.g., connected to) the fiber optic cable 106. The light source component 108 can be part of the chassis component 102, for example. The light source component 108 can generate a light signal that can be input to the fiber optic cable 106 to transmit the light signal through the fiber optic cable 106 to the sensor head component 104. The chassis component 102 also can comprise a sensor management component 110 (SMC) that can comprise various electronic components and circuitry (e.g., loop electronics for a control loop) that can be employed to control various components and functions of the sensor system 100. In accordance with various embodiments, the sensor management component 110 can comprise a processor(s), microprocessor(s), controller(s), memory(ies) (e.g., volatile or nonvolatile memory), interface(s), or other desired electronic components and circuitry that can perform respective functions and operations to control operations of the various components and functions of the sensor system 100 and facilitate sensing of current, voltage, or power at a desired point of an electrical power system. For instance, the sensor management component 110 can control operation of the light source component 108 to control the light signal, including the characteristics (e.g., light level or intensity, or light wavelengths or wavelength range, . . . ) of the light signal, being emitted by the light source component 108.

The chassis component 102 also can include a photodetector component 112 that can detect lights signals being returned from the sensor head component 104. The photodetector component 112 (PHOTO DET.) can be associated with (e.g., connected to) the return fiber optic cable 114, which can be associated with the sensor head component 104, and can run or span from the sensor head component 104 to the photodetector component 112. The photodetector component 112 also can be associated with (e.g., communicatively or electronically connected to) the sensor management component 110, which can control operations of the photodetector component 112 or can process information (e.g., sensor information or signals) received by the photodetector component 112 in the received (e.g., returned) light signals. In some embodiments, the photodetector component 112 can detect characteristics (e.g., light level or intensity, or light wavelengths or wavelength range, . . . ) of the received light signal, wherein the detected characteristics of the received light signal can indicate the amount of electrical current or voltage that was sensed by the sensor head component 104 at the desired point of the electrical power system. For example, the photodetector component 112 can detect characteristics of the received light signal that can be due to the Faraday effect experienced by, and impacting, the light signal and the sensing fiber component 116 of the sensor head component 104 as a result of the electrical current flowing at the desired point (e.g., power line at the desired point) being sensed by the sensing fiber component 116.

The sensor head component 104 can comprise a rotator component 118 (ROTATOR), the sensing fiber component 116, a quarter waveplate component 120, and a mirror component 122. The rotator component 118 can receive light signals transmitted via the fiber optic cable 106, and can redirect a received light signal based at least in part on the flow direction of the received light signal. For instance, the rotator component 118 can comprise a rotator element that can act or operate similar to a telecommunication circulator element, wherein the rotator element can redirect a light signal depending on its flow direction. The rotator component 118 also can apply a desired polarization and a desired phase shift to a received light signal, based at least in part on a defined polarization factor and a defined phase shift factor, to polarize and phase shift the received light signal in a desired and controlled manner. The rotator component 118 can thus comprise a rotator element, a polarizer element, and a phase shift element that can perform the respective functions of rotating, polarizing, and phase shifting the received light signals. In some embodiments, the phase shift element can bias the interferometer at the midpoint of the $\sin^2$ sensor response function (sine-squared function). Without the phase shift, the interferometer would be at a maximum of the $\sin^2$ response function. At this maximum, the slope of the response function is zero, and the sensor can be insensitive to relatively small currents. With the phase shift element biasing the interferometer at the midpoint of the $\sin^2$ response function, the sensor (e.g., sensor system 100) can be in a desired "linear" portion (e.g., the relatively or substantially linear portion) of the $\sin^2$ response function and can be able to sense and measure relatively small currents. Such functions (e.g., rotating, polarizing, phase shifting) can be performed by the rotator component 118 to process the received light signal to generate a polarized light signal (e.g., a linearly polarized light signal) as an output from the rotator component 118, wherein the polarized light signal can be utilized to facilitate desirable sensing of electrical current by the sensing fiber component 116.

The quarter waveplate component 120 can be associated with (e.g., connected to) the rotator component 118 and can receive the polarized light signal from the rotator component 118. The quarter waveplate component 120 can comprise a quarter waveplate fiber element that can modify (e.g., change) the polarized light signal to a circular polarization state. The Faraday effect from the current being sensed by the sensor system 100 (e.g., the Sagnac interferometer) can be desirably (e.g., optimally, suitably, or acceptably) detected (e.g., sensed) by the sensor system 100 when the polarized light signal is in a circular polarization state. The sensing fiber of the sensing fiber component 116 can allow circular polarization states to propagate with relatively little change except for the Faraday effect due to the current passing through an aperture (e.g., opening or gap) that can be formed by the sensing fiber closing a circular path around the current carrying conductor (e.g., the power line). Accordingly, as the polarized light signal travels through the sensing fiber component 116, the polarized light signal can be modified by or in the sensing fiber component 116 due to the Faraday effect from the current being sensed, and the sensing fiber component 116 can generate a processed light signal as an output, wherein the processed light signal can be a sensor signal that can comprise sensor information related to (e.g., that can indicate) an amount of current that was detected by the sensing fiber component 116. For instance, changes in characteristics in the polarized light signal that result in the generation of the processed light signal can provide sensor information that can indicate the amount of current detected by the sensing fiber component 116.

The mirror component 122 can comprise a reflective element, such as, for example, a reflective coating. The mirror component 122 can be located at the end of the sensing fiber of the sensing fiber component 116, wherein the reflective element of the mirror component 122 can facilitate reflecting or redirecting the processed light signal from the sensing fiber component 116 to have the processed light signal return to the chassis component 102, via fiber optic cable 114, for detection by the photodetector component 112 and further processing by the sensor management component 110 and other components of the sensor system 100. The mirror component 122 can thus facilitate forming a loop of light inside the sensing fiber component 116.

As disclosed, the photodetector component 112 can detect light signals (e.g., processed light signals) being returned from the sensor head component 104 via the fiber optic cable 114. The returned light (e.g., the received processed light signal) can be modulated at the drive frequency of the current that was detected by the sensing fiber component 116. The photodetector component 112 can detect characteristics of the received processed light signal, wherein the detected characteristics of the received processed light signal can indicate the amount of electrical current that was sensed by the sensing fiber component 116 at the desired point (e.g., desired power line) of the electrical power system. For instance, the photodetector component 112 or the sensor management component 110 can demodulate the changes in the characteristics of the light signal, which can enable the photodetector component 112 or the sensor management component 110 to measure the Faraday effect on the sensing fiber of the sensing fiber component 116, and accordingly, to measure the amount of current or voltage at the desired point (e.g., power line) that was sensed by the sensing fiber component 116.

In some embodiments, the amount of current sensed by the sensor system 100 can be determined (e.g., by the sensor management component 110 or photodetector component 112) as a digital numerical value (e.g., digital numerical current value). The sensor management component 110 can be associated with (e.g., communicatively connected to) a digital interface component 124 (DIG. I/F). The sensor management component 110 can present (e.g., transmit or communicate) the digital numerical value as a digital output through the digital interface component 124, for example, with an Ethernet format or other desired communication format. In certain embodiments, the sensor system 100 can comprise a converter component 126 (CONVERTER 126) that can employ a digital-to-analog (D/A) converter to convert the digital numerical value for the current to an analog voltage or low energy analog (LEA) output. The analog voltage or LEA output typically can range from 4 volts (V) to 10 V, for example.

The sensor system 100 also can include a converter component 128 (CONVERTER 128) that can be associated with (e.g., connected to) the converter component 126. The converter component 128 can receive the analog voltage or LEA output from the converter component 126, and can convert the analog voltage or LEA output to a current via an amplifier or other components or circuitry of the converter component 128 to produce a high energy analog (HEA) output. The HEA output can be used for metering applications where a revenue meter can use the HEA output to ratio the current on the high power line and calculate the amount of kilowatt hours (kWh) used.

As disclosed, associating the fiber optic cable 106 with (e.g., wrapping the fiber optic cable 106 around, or integrating the fiber optic cable 106 with) an electrical conductor cable (e.g., 212) or a ground wire (e.g., 302) can result in undesired (e.g., unwanted) fiber link pickup (e.g., Faraday pickup, vibrational pickup, . . . ) in the fiber optic cable 106. For instance, associating the fiber optic cable 106 with the electrical conductor cable (e.g., 212) or ground wire (e.g., 302) can result in undesired Faraday effects, vibrational effects, or other optical-related effects that can negatively impact (e.g., can cause current or voltage sensing and measurement errors) in the sensor system 100 when the sensor system 100 is sensing and measuring current or voltage at a desired point (e.g., power line) of an electrical power system. In accordance with various embodiments, to overcome these and other problems associated with sensing and measuring electrical currents or voltages, the sensor system 100 can employ desirable depolarizer arrangements that can desirably process (e.g., depolarize) light signals in the fiber optic cable 106 to mitigate, reduce, or counteract the undesired Faraday effects, vibrational effects, or other optical-related effects that can be produced by associating the fiber optic cable 106 with an electrical conductor cable (e.g., 212) or a ground wire (e.g., 302). The disclosed subject matter can utilize a relatively small amount of additional polarization maintaining (PM) fiber material, for example, 10 meters or less (e.g., approximately 7.5 meters), for the depolarization components, as described herein, wherein such additional PM fiber material can be relatively inexpensive and can make employing the disclosed depolarizer arrangements a desirable approach to take to address (e.g., mitigate) the undesired Faraday effects, vibrational effects, or other optical-related effects.

In some embodiments, the sensor system 100 can comprise a first depolarizer component 130 and a second depolarizer component 132 that can be associated with (e.g., integrated with or attached to) the fiber optic cable 106 and can desirably process (e.g., depolarize) light signals in the fiber optic cable 106. The first depolarizer component 130 can be located in the chassis component 102. For instance, the first depolarizer component 130 can be associated with the fiber optic cable 106 such that the first depolarizer component 130 can be in proximity to (e.g., within a desired distance of) the light source component 108. The first depolarizer component 130 can be located a relatively short distance (e.g., less than 1 meter, 1 meter, 2 meters, or other desired distance less than or greater than 2 meters) away from the light source component 108, for example.

In certain embodiments, the second depolarizer component 132 can be located in the sensor head component 104. For example, the second depolarizer component 132 can be associated with the fiber optic cable 106 such that the second depolarizer component 132 can be in proximity to (e.g., within a desired distance of) the rotator component 118. The second depolarizer component 132 can be located a relatively short distance (e.g., less than 1 meter, 1 meter, 2 meters, or other desired distance less than or greater than 2 meters) away from the rotator component 118, for example. The first depolarizer component 130 and the second depolarizer component 132 generally can be substantially the same, although there can be some differences between the second depolarizer component 132 and the first depolarizer component 130 (e.g., the second depolarizer component 132 can be longer in length than the first depolarizer component 130; there can be differences in the links of the fibers between the second depolarizer component 132 and the first depolarizer component 130).

The first depolarizer component 130 and the second depolarizer component 132 can be Lyot or Lyot-type depolarizer components (e.g., depolarizers). In some embodiments, a Lyot depolarizer can comprise two or more items of birefringent material (e.g., birefringent optical fiber) that can be spliced together at a desired defined angle (e.g., 45 degree angle). A depolarizer component (e.g., 130 or 132) can receive a light signal at the input of the depolarizer component and can depolarize, or otherwise process or condition, the light signal to generate a depolarized light signal at the output of the depolarizer component. The first depolarizer component 130 and the second depolarizer component 132 (e.g., Lyot depolarizers) each can have a desired number (e.g., two or more) of stages, wherein typically the more stages a depolarizer component has, the more effective the depolarizer component can be in depolarizing the light. For example, the first depolarizer component 130 and the second depolarizer component 132 each can be two-stage Lyot depolarizer components, although, in other example embodiments, the first depolarizer component 130 and the second depolarizer component 132 each can be a higher-stage (more than two-stage) Lyot depolarizer components.

In certain embodiments, the Lyot or Lyot-type depolarizer components can be fiber-optic depolarizers, wherein the first depolarizer component 130 and second depolarizer component 132, as fiber-optic Lyot or Lyot-type depolarizers, can comprise a fiber optic element (e.g., a section of fiber optic material) that can be integrated with the fiber optic cable 106 at the desired locations of the first depolarizer component 130 and second depolarizer component 132 in the chassis component 102 and sensor head component 104, respectively. In other embodiments, the Lyot or Lyot-type depolarizer components can be bulk-optic depolarizers, wherein the first depolarizer component 130 and second depolarizer component 132, as bulk-optic Lyot or Lyot-type depolarizers, can comprise bulk-optic elements that can be connected to or integrated with the fiber optic cable 106 at the desired locations of the first depolarizer component 130 and second depolarizer component 132 in the chassis component 102 and sensor head component 104, respectively. When a bulk-optic element is used, the fiber optic cable 106 can be split at the location where the depolarizer (e.g., first depolarizer component 130, or second depolarizer component 132) is to be inserted, and one end of one portion of the fiber optic cable 106 can be connected to one end of the bulk-optic depolarizer element, and the other end of the bulk-optic depolarizer element can be connected to an end of the other portion of the fiber optic cable 106. As a result, there can be a transfer from fiber optic cable to the bulk-optic depolarizer element (e.g., first depolarizer component 130, or second depolarizer component 132) and a transfer from the bulk-optic depolarizer element back to the fiber optic cable 106.

The light source component 108 can generate a light signal that can be input to the fiber optic cable 106, wherein there can be a first portion 134 of the fiber optic cable 106 between the light source component 108 and the first depolarizer component 130. The first depolarizer component 130 can receive the light signal from the first portion 134 of the fiber optic cable 106. The light signal can be polarized to a certain degree due to a number of factors, including, for example, polarization from the drive/control unit (e.g., light source component 108, sensor management component 110, or other components) of the chassis component 102 or a polarization dependent loss effect on the first portion 134 of the fiber optic cable 106. The first depolarizer component 130 can desirably depolarize or otherwise process the light signal to generate a first depolarized light signal as an output.

The output of the first depolarizer component 130 can be associated with (e.g., connected to or integrated with) a second portion 136 of the fiber optic cable 106. The second portion 136 of the fiber optic cable 106 can receive the first depolarized light signal from the output of the first depolarizer component 130. In accordance with various embodiments, at least part of the second portion 136 of the fiber optic cable 106 can be associated with (e.g., wrapped around, attached to, integrated with, or otherwise associated with) an electrical conductor wire (e.g., 212) or a ground wire (e.g., 302) (e.g., as depicted in FIGS. 2 and 3, and as described herein). The fiber optic cable 106 (e.g., a single mode fiber link) used to transmit the light signals can have a polarization dependent loss, which can act as a polarizer to some extent, which, for instance, can lead to an intensity change that can be correlated with the current flowing through the electrical conductor cable (e.g., 212) with which the second portion 136 of the fiber optic cable 106 is associated (when the second portion 136 of the fiber optic cable 106 is associated with the electrical conductor cable). As more fully described herein, the second portion 136 of the fiber optic cable 106 can be impacted (e.g., negatively impacted) by undesired (e.g., unwanted) Faraday effects, vibrational effects, or other optical-related effects. For instance, the second portion 136 of the fiber optic cable 106 can be subject to polarization dependent losses due to the current flowing in the electrical conductor cable (e.g., 212) (when the second portion 136 of the fiber optic cable 106 is associated with the electrical conductor cable), which can result in the light signal being subjected to Faraday effects, or due to vibrations of the second portion 136 of the fiber optic cable 106 or the associated electrical conductor cable (e.g., 212) or ground wire (e.g., 302) (as applicable to the situation) that can cause macro and micro bends in the fibers of the second portion 136 of the fiber optic cable 106. As a result, as the first depolarized light signal is carried (e.g., transmitted) through the second portion 136 of the fiber optic cable 106, the first depolarized light signal (e.g., the characteristics of the first depolarized light signal) can be altered, for instance, re-polarized, to some extent to generate an altered or re-polarized light signal, wherein the amount or degree of re-polarization of the first depolarized light signal can be based at least in part on the respective levels of the Faraday effects, vibrational effects, or other optical-related effects to which the second portion 136 of the fiber optic cable 106 has been subjected.

The other end of the second portion 136 of the fiber optic cable 106 can be associated with (e.g., connected to or integrated with) the second depolarizer component 132. The second depolarizer component 132, which can be placed before and in proximity to the rotator component 118, can desirably remove or at least significantly minimize the ability of the sensor system (e.g., the sensing fiber component 116 of the sensor system) to be sensitive to the undesired Faraday effects and other undesired effects, in part, because the phase shift in the light signal due to the Faraday effect can be decorrelated in the second depolarizer component 132. The second depolarizer component 132 can receive the altered (e.g., re-polarized) light signal from the second portion 136 of the fiber optic cable 106. The second depolarizer component 132 can desirably depolarize or otherwise process the altered light signal to generate a second depolarized light signal that can be output from the second depolarizer component 132. For instance, the second depolarizer component 132 can depolarize the altered light signal to reduce or counter the (re)polarization of the light signal (e.g., first depolarized light signal) as it is carried through the second portion 136 of the fiber optic cable 106 due to the Faraday effects, vibrational effects, or other optical-related effects that can occur as a result of the second portion 136 of the fiber optic cable 106 being associated with the electrical conductor cable (e.g., 212) or the ground wire (e.g., 302). Reducing the degree of polarization in the fiber optic cable 106 and associated light signal can reduce the effect of any changes (e.g., undesired changes) in the polarization state of the light signal that is coming into the sensor head component 104, and, in particular, the sensing fiber component 116 of the sensor head component 104.

The other end of the second depolarizer component 132 can be associated with (e.g., connected to or integrated with) a third portion 138 of the fiber optic cable 106. The third portion 138 of the fiber optic cable 106 can receive the second depolarized light signal from the second depolarizer component 132 and can carry (e.g., transmit) the second depolarized light signal to the input of the rotator component 118, which can be associated with (e.g., connected to) an end of the third portion 138 of the fiber optic cable 106. It is to be appreciated and understood that, in some embodiments, the second depolarizer component 132 can be arranged to be directly connected to the input of the rotator component 118, wherein the third portion 138 of the fiber optic cable 106 can be omitted.

The rotator component 118 can redirect, desirably polarize, and apply a desired phase shift to the second depolarized signal, wherein the polarization and phase shifting of the second depolarized light signal can be performed by the rotator component 118 in a desirably controlled manner based at least in part on a defined polarization factor and defined phase shift factor, as more fully described herein. The quarter waveplate component 120 can receive the polarized light signal from the rotator component 118, and the quarter waveplate fiber element of the quarter waveplate component 120 can modify (e.g., change) the polarized light signal to a circular polarization state, as described herein.

The sensing fiber component 116 can receive the polarized light signal in the circular polarization state. As described herein, the sensing fiber of the sensing fiber component 116 can allow circular polarization states to propagate with relatively little change except for the Faraday effect due to the current passing through an aperture that can be formed by the sensing fiber closing a circular path around the current carrying conductor (e.g., the power line being monitored and sensed by the sensing fiber component 116). Accordingly, as the polarized light signal travels through the sensing fiber component 116, the polarized light signal can be modified by or in the sensing fiber component 116 due to the Faraday effect from the current being sensed at the desired point (e.g., the power line) of the electrical power system to produce a processed light signal as an output, wherein the processed light signal can be a sensor signal that can comprise sensor information related to (e.g., that can indicate) an amount of current that was detected by the sensing fiber component 116.

The depolarizing of the light signal by the first depolarizer component 130, and, in particular, the depolarizing of the (altered) light signal by second depolarizer component 132 can improve the environmental sensitivity of the sensor system and can enable the sensor system (e.g., the sensing fiber component 116 of the sensor system) to desirably and accurately sense the amount of current or voltage at the desired point (e.g., the power line) of the electrical power system, as the undesired polarization of light signals, due to the Faraday effects, vibrational effects, or other optical-related effects from the second portion 136 of the fiber optic cable 106 being associated with the electrical conductor cable (e.g., 212) or ground wire (e.g., 302), or the undesired polarization of light signals due to polarization effects associated with the chassis component 102, can be reduced (e.g., mitigated, minimized, or eliminated) by employing the first and second depolarizer components 130 and 132. This can reduce (e.g., mitigate, minimize, or eliminate) the amount of error in the sensing and measurement of the electrical current or voltage at the desired point (e.g., the power line) of the electrical power system. For example, the disclosed subject matter, by employing the depolarizer arrangements described herein, can improve the accuracy of sensing and measurement electrical currents from 2% accuracy to a desirable 1% accuracy (or better) over a temperature range of −40 degrees Celsius to 55 degrees Celsius.

Figure 4:
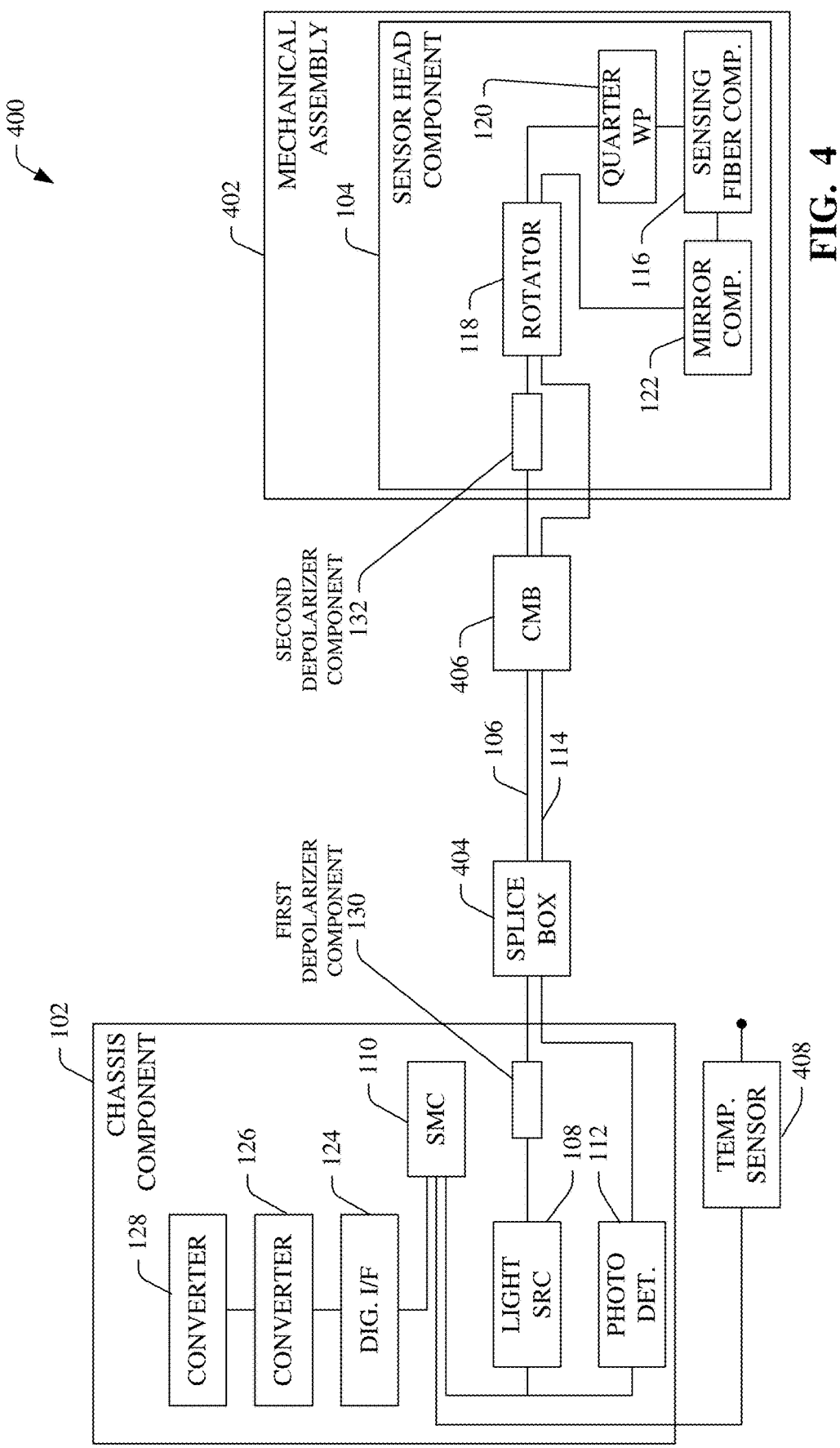
FIG. 4 illustrates a block diagram of an example system that can employ a depolarizer arrangement and a remote temperature sensor to improve the accuracy of sensing electrical currents at a desired point (e.g., power line) of an electrical power system, in accordance with various aspects and embodiments of the disclosed subject matter.

FIG. 4 illustrates a block diagram of an example system 400 that can employ a depolarizer arrangement and a remote temperature sensor to improve the accuracy of sensing electrical currents at a desired point (e.g., power line) of an electrical power system, in accordance with various aspects and embodiments of the disclosed subject matter. The system 400 (e.g., sensor system) can comprise a chassis component 102, sensor head component 104, fiber optic cable 106, light source component 108, sensor management component 110, photodetector component 112, fiber optic cable 114, sensing fiber component 116 (SENSING FIBER COMP.), rotator component 118, quarter waveplate component 120 (QUARTER WP), mirror component 122 (MIRROR COMP.), digital interface component 124, converter component 126, converter component 128, first depolarizer component 130, and second depolarizer component 132. The respective components can be the same as or similar to, and can comprise the same or similar features and functionality as, respective components (e.g., respectively named components), such as more fully described herein.

The system 400 can include a mechanical assembly 402 that, in some embodiments, can be an HV column, which can be a type of mechanical assembly that can be associated with a high voltage power line of the electrical power system, and in other embodiments, the mechanical assembly 402 can be associated with a lower voltage power cable of the electrical power system. In accordance with various embodiments, the sensor head component 104 can be associated with or part of the mechanical assembly 402. The sensor head component 104 can be associated with a desired electrical component, such as a power line, associated with the mechanical assembly 402 to facilitate sensing and measuring the electrical current or voltage associated with (e.g., flowing through) the desired electrical component of the electrical power system.

The system 400 can comprise a splice box 404 that can be associated with the chassis component 102. The splice box 404 (e.g., a telecommunications splice box) can be utilized to splice together the fibers of the fiber optic cable 106 to prepare the fiber optic cable 106 for long transmissions of up to 20 km (or more), wherein the fiber optic cable 106 can span from the chassis component 102 to the sensor head component 104 associated with the mechanical assembly 402 at a remote location, which can be up to 20 km (or more) away from the chassis component 102.

The system 400 also can comprise a cable management box (CMB) 406 that can be located at a remote location relative to the chassis component 102 and splice box 404, wherein the CMB 406 can be located in proximity to, and can be associated with, the sensor head component 104. The CMB 406 can be another type of slice box that can be made very rugged for industrial utility applications to facilitate maintaining the components (e.g., maintaining the integrity and functionality of the components), such as the fiber optic cable 106, which can be fed to (e.g., inserted into) and through the CMB 406 to the sensor head component 104.

In some embodiments, the system 400 can comprise a remote temperature sensor component 408 (TEMP. SENSOR) that can sense or measure temperature in a desired area (outdoor area) associated with the chassis component 102 or the mechanical assembly 402. The temperature can have a relatively small, but still significant effect, on the Faraday effect, which can impact (e.g., negatively impact) the accuracy of measuring the electrical current, as such measuring of the electrical current can be based at least in part on the Faraday effect experienced by the light signal at the sensing fiber component 116. The remote temperature sensor component 408 can measure the temperature in the desired area and can transmit sensor data, which can indicate the temperature, to the sensor management component 110. The sensor management component 110 can analyze the sensor data relating to temperature, along with analyzing the processed light signal, comprising sensor information indicating the electrical current or voltage at the desired point (e.g., power line). Based at least in part on the temperature in the desired area, the sensor management component 110 can adjust (or not adjust) the measurement of the electrical current or voltage to correct the measurement of the electrical current or voltage to account for any temperature effect that the temperature can have on the Faraday effect, and thus, the current or voltage measurement. Such correcting of the current or voltage measurement to account for the temperature effect can enable the system 400 to provide higher accuracy measurements of electrical current at the desired point (e.g., power line) of the electrical power system across a relatively wide temperature range (e.g., −40 degrees Celsius to 55 degrees Celsius).

Figure 5:
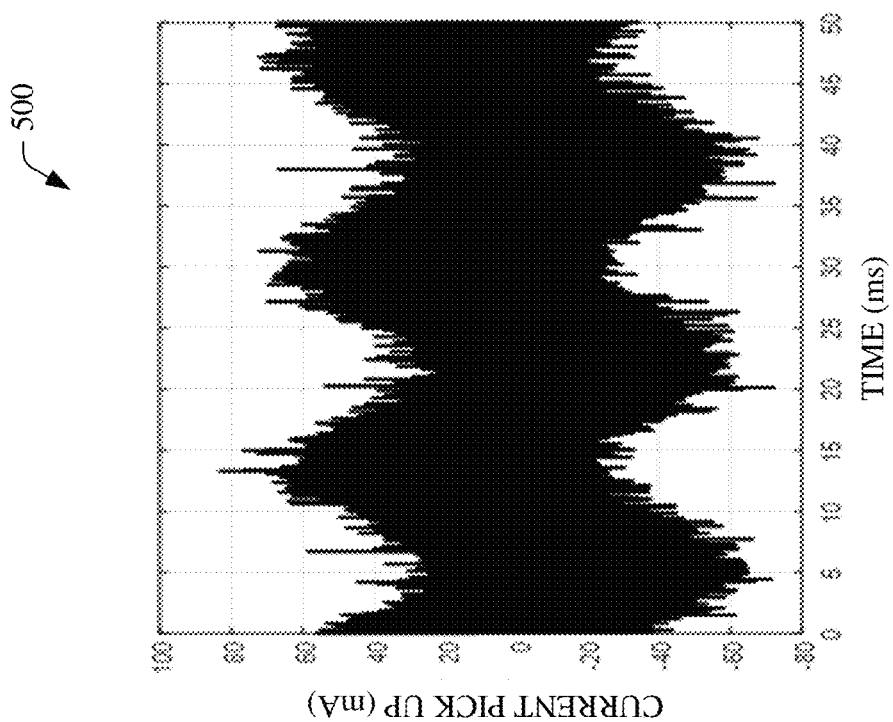
FIG. 5 presents a diagram of an example graph of experimental results of current pickup over time by a fiber optic cable wrapped around a 3000 amp (A) electrical conductor without a Lyot-type depolarizer arrangement being utilized at a chassis component or sensor head component of the sensor system.

FIGS. 5-8 present diagrams of example graphs containing respective experimental results of sensing electrical currents with and without employing the depolarizer arrangements of the disclosed subject matter. FIG. 5 presents a diagram of an example graph 500 of experimental results of current pickup over time by a fiber optic cable wrapped around a 3000 amp (A) electrical conductor without a Lyot-type depolarizer arrangement being utilized at the chassis component or sensor head component. As can be observed in the example graph 500, there can be approximately 30 milliamp (mA) current pickup by the fiber optic cable (as can be observed by the wave form in the graph 500) when the fiber optic cable is wrapped around the 3000 A electrical conductor without the Lyot-type depolarizer arrangement at the chassis component or sensor head component.

Figure 6:
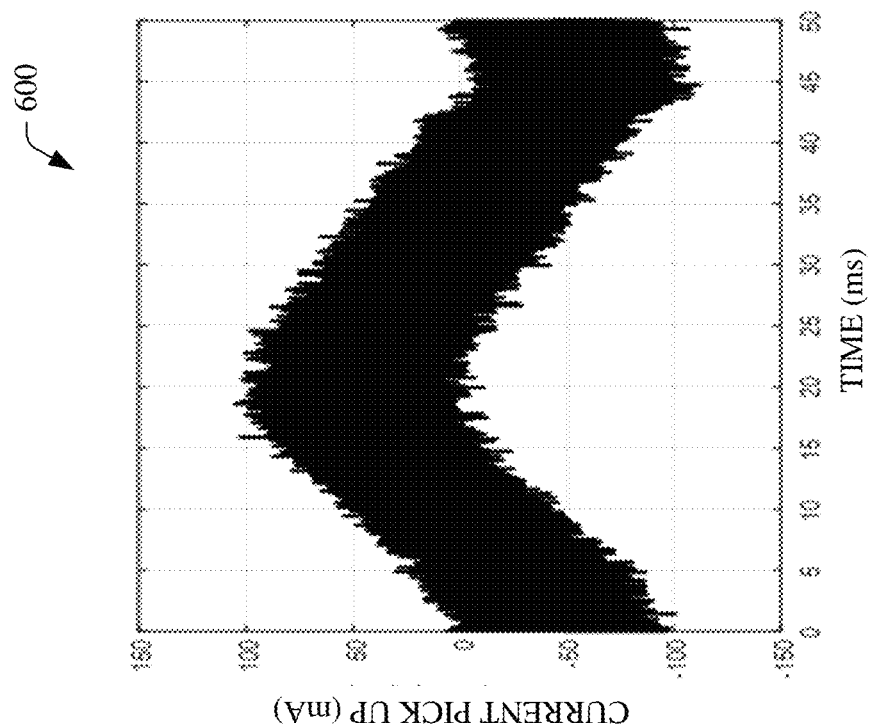
FIG. 6 presents a diagram of an example graph of experimental results of vibrational pickup over time by a fiber optic cable wrapped around a 3000 A electrical conductor without a Lyot-type depolarizer arrangement being utilized at the chassis component or sensor head component.

FIG. 6 presents a diagram of an example graph 600 of experimental results of vibrational pickup over time by a fiber optic cable wrapped around a 3000 A electrical conductor without a Lyot-type depolarizer arrangement being utilized at the chassis component or sensor head component. As can be seen in the example graph 600, there can be a distinctive vibrational pickup by the fiber optic cable (as can be observed by the wave form in the graph 600) when the fiber optic cable is wrapped around the 3000 A electrical conductor without the Lyot-type depolarizer arrangement at the chassis component or sensor head component.

Figure 7:
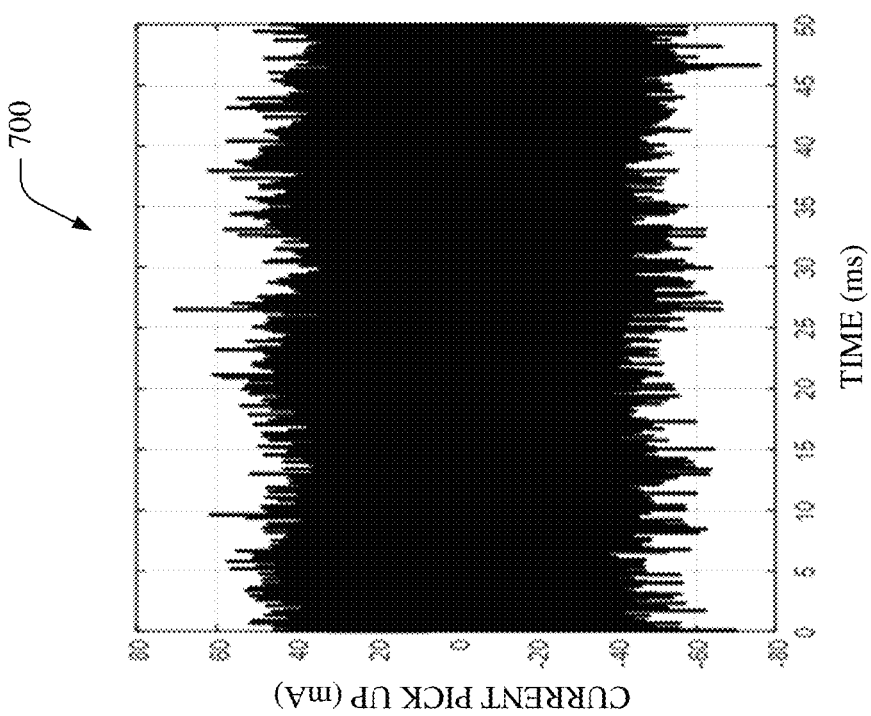
FIG. 7 presents a diagram of an example graph of experimental results that illustrate no observable current pickup over time by a fiber optic cable wrapped around a 3000 A electrical conductor when a Lyot-type depolarizer arrangement being is employed at the chassis component and the sensor head component, in accordance with various aspects and embodiments of the disclosed subject matter.

FIG. 7 presents a diagram of an example graph 700 of experimental results that illustrate no observable current pickup over time by a fiber optic cable wrapped around a 3000 A electrical conductor when a Lyot-type depolarizer arrangement being is employed at the chassis component and the sensor head component, in accordance with various aspects and embodiments of the disclosed subject matter. As can be seen in the example graph 700, there is no observable current pickup by the fiber optic cable due to the fiber optic cable being wrapped around the 3000 A electrical conductor when the Lyot-type depolarizer arrangement is utilized at the chassis component and the sensor head component. The Lyot-type depolarizer arrangement, by being utilized at the chassis component and the sensor head component, was able to reduce (e.g., mitigate, minimize, or eliminate) current pickup by the fiber optic cable that would otherwise have occurred, if no Lyot-type depolarizer arrangement had been used, due to the fiber optic cable being wrapped around the 3000 A electrical conductor.

Figure 8:
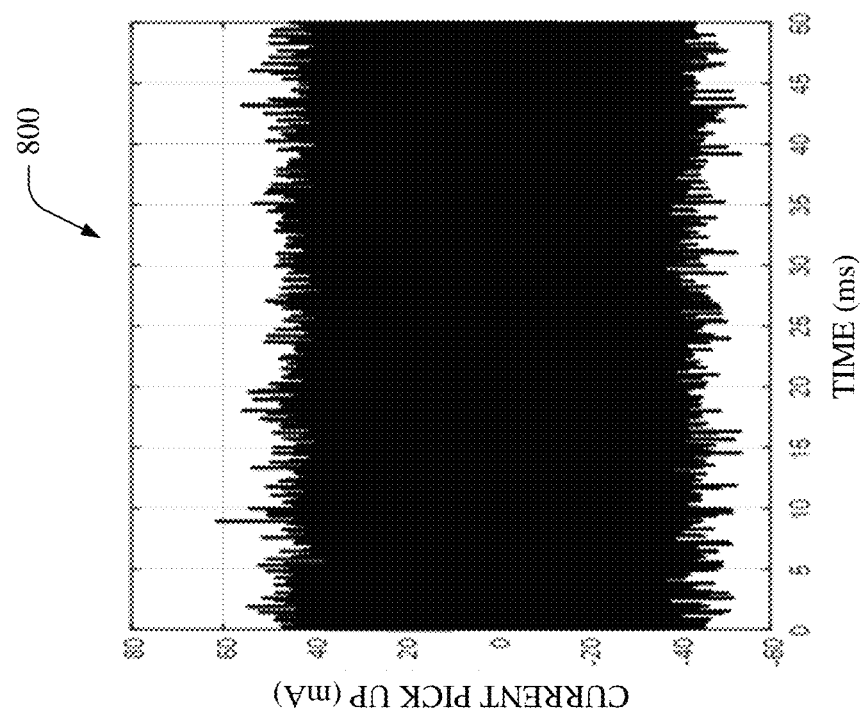
FIG. 8 presents a diagram of an example graph of experimental results that illustrate no observable vibrational pickup over time by a fiber optic cable wrapped around a 3000 A electrical conductor when a Lyot-type depolarizer arrangement is being employed at the chassis component and the sensor head component, in accordance with various aspects and embodiments of the disclosed subject matter.

FIG. 8 presents a diagram of an example graph 800 of experimental results that illustrate no observable vibrational pickup over time by a fiber optic cable wrapped around a 3000 A electrical conductor when a Lyot-type depolarizer arrangement is being employed at the chassis component and the sensor head component, in accordance with various aspects and embodiments of the disclosed subject matter. As can be observed in the example graph 800, there is no observable vibrational pickup by the fiber optic cable due to the fiber optic cable being wrapped around the 3000 A electrical conductor when the Lyot-type depolarizer arrangement is utilized at the chassis component and the sensor head component. The Lyot-type depolarizer arrangement, by being utilized at the chassis component and the sensor head component, was able to reduce (e.g., mitigate, minimize, or eliminate) vibrational pickup by the fiber optic cable that would otherwise have occurred, if no Lyot-type depolarizer arrangement had been used, due to the fiber optic cable being wrapped around the 3000 A electrical conductor.

Figure 9:
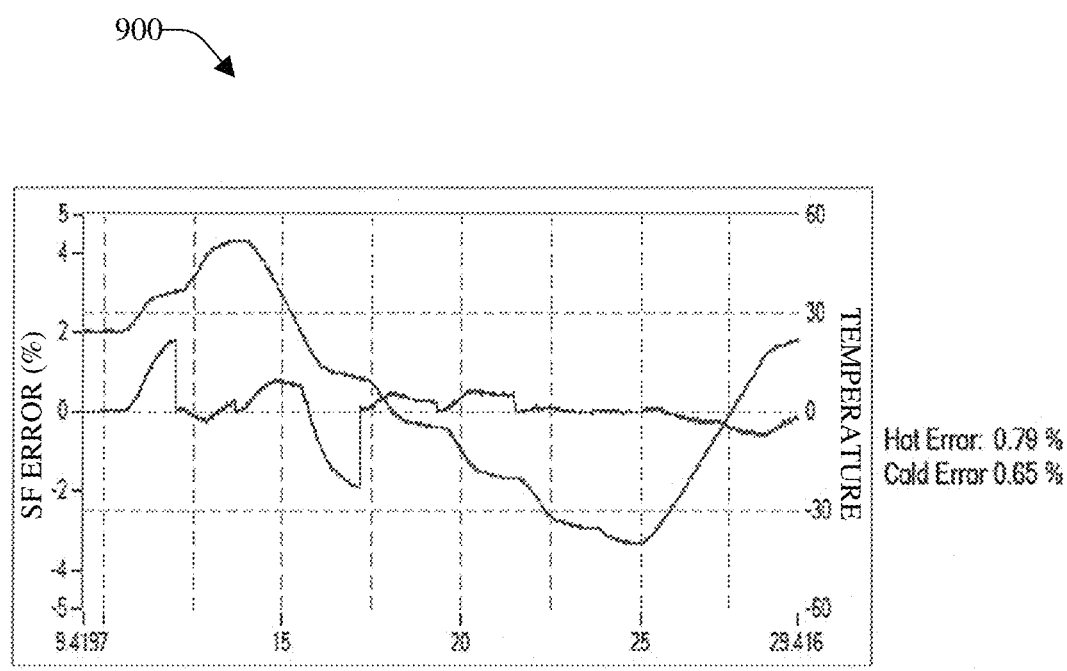
FIG. 9 presents a diagram of an example graph of experimental results of current sensing accuracy by a current sensor over a temperature range when a fiber optic cable is wrapped around an electrical conductor with a Lyot-type depolarizer arrangement being employed at the chassis component and the sensor head component, in accordance with various aspects and embodiments of the disclosed subject matter.

FIG. 9 presents a diagram of an example graph 900 of experimental results of current sensing accuracy by a current sensor over a temperature range of −40 degrees Celsius to 55 degrees Celsius when a fiber optic cable is wrapped around an electrical conductor with a Lyot-type depolarizer arrangement being employed at the chassis component and the sensor head component, in accordance with various aspects and embodiments of the disclosed subject matter. The measurement data in the graph 900 can be temperature corrected using the techniques described herein. As can be observed by the graph 900, for the current sensor when the Lyot-type depolarizer arrangement is employed at the chassis component and the sensor head component, the scale factor (SF) error desirably can be lower than 1% across the temperature range of −40 degrees Celsius to 55 degrees Celsius. For instance, at a temperature of −40 degrees Celsius, the SF error can be 0.65% (Cold Error), and at a temperature of 55 degrees Celsius, the SF error can be 0.79% (Hot Error).

Figure 10:
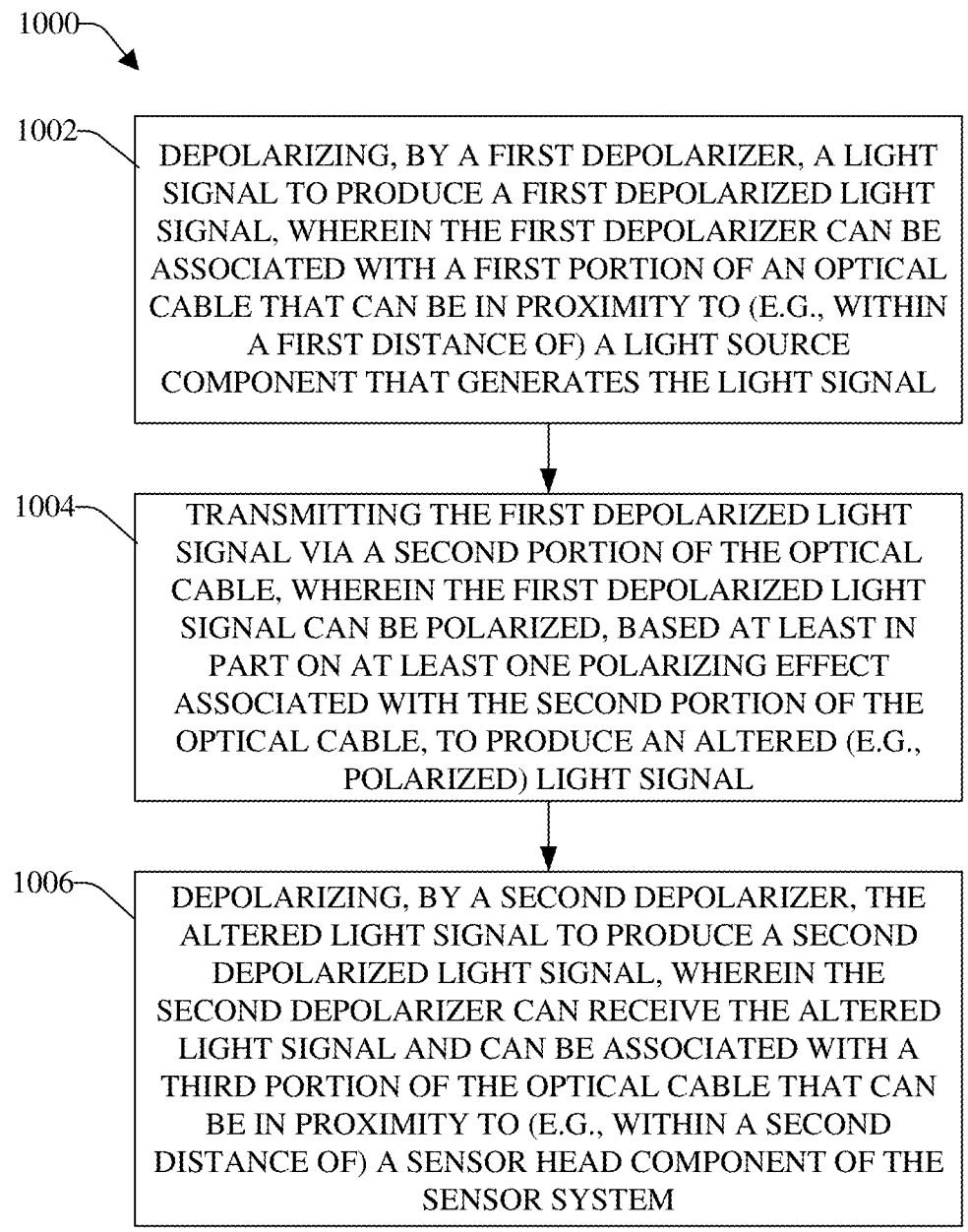
FIG. 10 depicts a diagram of a flowchart of an example method that can efficiently depolarize a light signal to facilitate desirably accurate sensing and measurement of an electrical current or a voltage, in accordance with various aspects and embodiments of the disclosed subject matter.
Figure 11:
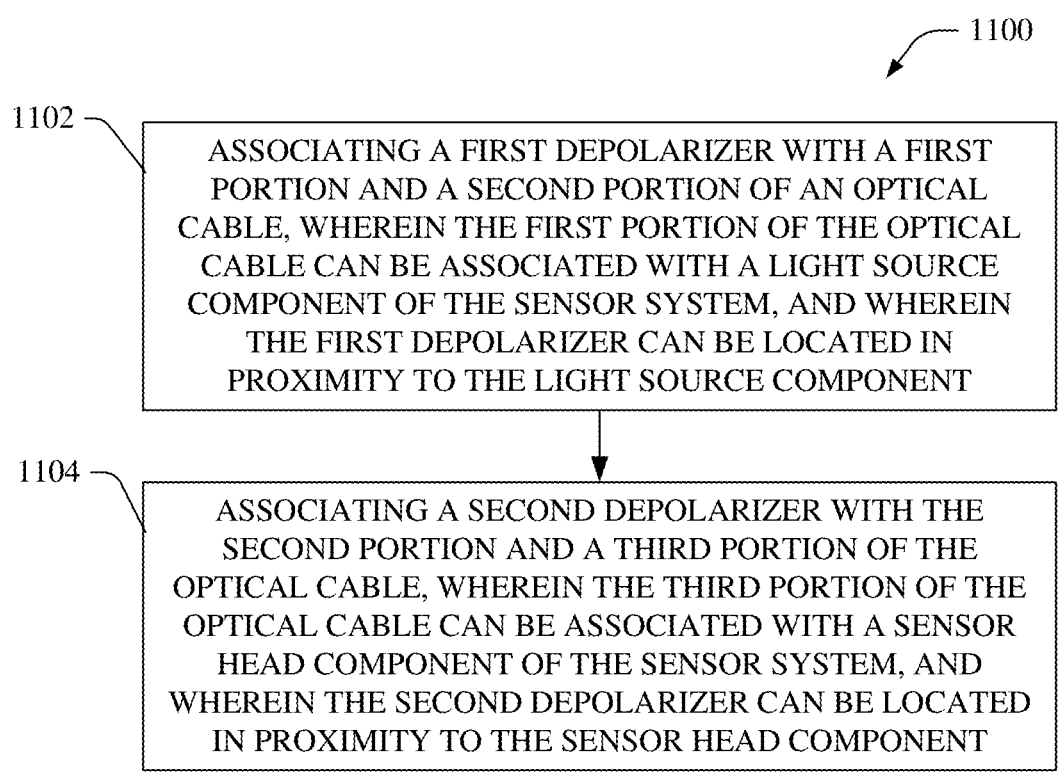
FIG. 11 illustrates a diagram of a flowchart of an example method that can create a depolarizer arrangement for a sensor system to facilitate mitigating error in the sensing and measurement of an electrical current or a voltage, in accordance with various aspects and embodiments of the disclosed subject matter.

In view of the example systems, components, and devices described herein, example methods that can be implemented in accordance with this disclosure can be further appreciated with reference to flowcharts in FIGS. 10-11. For purposes of simplicity of explanation, various methods disclosed herein are presented and described as a series of acts; however, it is to be understood and appreciated that this disclosure is not limited by the order of acts, as some acts may occur in different order or concurrently with other acts from that shown and described herein. It is noted that not all illustrated acts may be required to implement a described method in accordance with this disclosure. In addition, for example, one or more methods disclosed herein could alternatively be represented as a series of interrelated states or events, such as in a state diagram. Moreover, interaction diagram(s) or call flow(s) represent several of the example methods disclosed herein in accordance with the described subject matter; particularly in instances when disparate entities, or functional elements, enact disparate portions of one or more of the several methods. Furthermore, two or more of the disclosed example methods can be implemented in combination, to accomplish one or more features or advantages described in this disclosure.

FIG. 10 depicts a diagram of a flowchart of an example method 1000 that can efficiently depolarize a light signal to facilitate desirably accurate sensing and measurement of an electrical current or a voltage, in accordance with various aspects and embodiments of the disclosed subject matter. At 1002, a light signal can be depolarized, by a first depolarizer, to produce a first depolarized light signal, wherein the first depolarizer can be associated with a first portion of an optical cable that can be in proximity to (e.g., within a first distance of) a light source component that generates the light signal. The light source component can be part of a chassis component of a sensor system (e.g., sensor device). The optical cable (e.g., optical fiber) can be fiber optic cable. The first depolarizer (e.g., first depolarizer component) can be a fiber-optic or bulk-optic, Lyot or Lyot-type depolarizer. In certain embodiments, the first depolarizer can comprise PM fiber material. The first depolarizer can be attached to or integrated with an end (e.g., output end) of the first portion of the optical cable.

At 1004, the first depolarized light signal can be transmitted via a second portion of the optical cable, wherein the first depolarized light signal can be polarized, based at least in part on at least one polarizing effect associated with the second portion of the optical cable, to produce an altered (e.g., polarized) light signal. An end (e.g., input end) of the second portion of the optical cable can be attached to or integrated with the output end of the first depolarizer. The second portion of the optical cable can receive the first depolarized light signal from the first depolarizer. As the first depolarized light signal is transmitted via the second portion of the optical cable, the first depolarized light signal can be polarized, based at least in part on at least one polarizing effect (e.g., Faraday effect, vibrational effect, or other optical-related effect) associated with the second portion of the optical cable, to produce the altered light signal.

In some embodiments, the second portion of the optical cable can be associated with an electrical conductor cable (e.g., electrical conductor wire) or a ground wire of an electrical power system. For example, the second portion of the optical cable can be wrapped around, attached to, integrated with, or otherwise associated with the electrical conductor cable or the ground wire of the electrical power system. The at least one polarizing effect can comprise, for example, a Faraday effect, a vibrational effect, or other an optical-related effect associated with the second portion of the optical cable, the electrical conductor cable, or the ground wire. For instance, if the optical cable is associated with the electrical conductor cable, as the first depolarized light signal is transmitted via the second portion of the optical cable, the electrical current carried by the electrical conductor cable can introduce or produce a Faraday effect or other optical-related effect on the first depolarized light signal traveling through the second portion of the optical cable, wherein the Faraday effect or optical-related effect can alter (e.g., polarize) the first depolarized light signal to produce the altered light signal.

With regard to the vibrational effect, if the optical cable is associated with the electrical conductor cable or if the optical cable is associated with the ground wire, as the first depolarized light signal is transmitted via the second portion of the optical cable, vibrations caused by the electrical current being carried through the second portion of the optical cable, or vibrations caused by environmental conditions (e.g., wind, seismic activity, . . . ) or other conditions (e.g., birds landing on the optical cable, electrical conductor cable, or ground wire), which can cause the second portion of the optical cable, electrical conductor cable, or ground wire to move, can produce a vibrational effect that can alter (e.g., polarize) the first depolarized light signal to produce the altered light signal.

At 1006, the altered light signal can be depolarized, by a second depolarizer, to produce a second depolarized light signal, wherein the second depolarizer can receive the altered light signal and can be associated with a third portion of the optical cable that can be in proximity to (e.g., within a second distance of) a sensor head component of the sensor system. For instance, the second depolarizer (e.g., a fiber-optic or bulk-optic, Lyot or Lyot-type depolarizer) can depolarize the altered light signal to reduce, minimize, or eliminate the polarization of the altered light signal (e.g., the polarization due to the Faraday effect, vibrational effect, or optical-related effect) to produce the second depolarized light signal. In some embodiments, the second depolarizer can comprise PM fiber material. With the mitigation of the polarization associated with the chassis-side of the sensor device (e.g., by the first depolarizer) and the mitigation of the polarization associated with the second portion of the optical cable (e.g., by the second depolarizer), which can be between the chassis and the sensor head component of the sensor system, the sensor system can more accurately sense or measure the electrical current or voltage of an electrical component (e.g., power line) or electrical subsystem of the electrical power system.

FIG. 11 illustrates a diagram of a flowchart of an example method 1100 that can create a depolarizer arrangement for a sensor system to facilitate mitigating error in the sensing and measurement of an electrical current or a voltage, in accordance with various aspects and embodiments of the disclosed subject matter. At 1102, a first depolarizer can be associated with a first portion and a second portion of an optical cable, wherein the first portion of the optical cable can be associated with a light source component of the sensor system, and wherein the first depolarizer can be located in proximity to the light source component. For instance, an input end of the first portion of the optical cable can be associated with (e.g., connected to) the output of the light source component, which can be part of an electronic chassis of the sensor system, wherein the electronic chassis can comprise a variety of components that can facilitate sensing electrical current or a voltage, as more fully described herein. In some embodiments, the optical cable can be a fiber optic cable. The output end of the first portion of the optical cable can be associated with (e.g., connected to or integrated with) an input of the first depolarizer (e.g., first depolarizer component). The first depolarizer can desirably depolarize the light signal received from the light source component. The first depolarizer can be a fiber-optic or bulk-optic, Lyot or Lyot-type depolarizer. In some embodiments, the first depolarizer can comprise PM fiber material. The output of the first depolarizer can be associated with (e.g., connected to or integrated with) the input of the second portion of the optical cable. The second portion of the optical cable can extend for a desired length, which can be up to 20 kilometers, wherein the second portion of the optical cable can be associated with (e.g., wrapped around, attached to, or integrated with) an electrical conductor cable or a ground wire of the electrical power system.

At 1104, a second depolarizer can be associated with the second portion and a third portion of the optical cable, wherein the third portion of the optical cable can be associated with a sensor head component of the sensor system, and wherein the second depolarizer can be located in proximity to the sensor head component. For example, an output end of the second portion of the optical cable can be associated with (e.g., connected to or integrated with) the input of the second depolarizer (e.g., second depolarizer component). The output of the second depolarizer can be associated with (e.g., connected to or integrated with) an input end of the third portion of the optical cable. The second depolarizer can be a fiber-optic or bulk-optic, Lyot or Lyot-type depolarizer. In some embodiments, the second depolarizer can comprise PM fiber material. The second depolarizer can depolarize the light signal (e.g., altered light signal) received from the second portion of the optical cable to counter or mitigate the polarization of such light signal as it passed through the second portion of the optical cable due to the Faraday effect, vibrational effects, or other effects from the electrical conductor cable, ground wire, or environmental conditions that can impact (e.g., negatively impact) such light signal.

The output end of the third portion of the optical cable can be associated with (e.g., connected to) an input of the sensor head component, wherein the sensor head component can be utilized to sense or measure an amount of electrical current or voltage at a desired point (e.g., power line) of an electrical power system. For example, the output end of the third portion of the optical cable can be associated with an input of a rotator component of the sensor head component, wherein the rotator component can redirect (e.g., rotate), polarize, and apply a phase shift to a light signal (e.g., an altered light signal) received from the second depolarizer in a desirably controlled manner, as more fully described herein. The sensor head component can comprise other components (e.g., a quarter waveplate fiber component, sensing fiber component, and mirror component, . . . ), as more fully described herein, wherein, as the polarized light signal proceeds from the rotator component through the sensor head component, the sensor head component (e.g., employing the sensor fiber component) can sense electrical current or a voltage at the desired point of the electrical power system and can produce a processed light signal that can include sensor information indicating the amount of the electrical current or voltage at the desired point of the electrical power system. The sensor head component can transmit the processed light signal back to a photodetector component of the chassis component, wherein the various components of the chassis component can analyze or process the processed light signal to determine the amount of electrical current or voltage at the desired point (e.g., power line) of the electrical power system, as more fully described herein. The depolarizer arrangement of the method 1100, by employing multiple depolarizers that can be arranged in relation to other components (e.g., the light source component, second portion of the optical cable, the rotator component, . . . ), such as described herein, can enhance (e.g., improve, increase, or optimize) the accuracy of the sensing of electrical current or voltage by the sensor system.

The aforementioned systems or devices have been described with respect to interaction between several components. It should be appreciated that such systems and components can include those components or sub-components specified therein, some of the specified components or sub-components, or additional components. Sub-components could also be implemented as components communicatively coupled to other components rather than included within parent components. Further yet, one or more components or sub-components may be combined into a single component providing aggregate functionality. The components may also interact with one or more other components not specifically described herein for the sake of brevity, but known by those of skill in the art.

It is to be appreciated and understood that components (e.g., depolarizer component, chassis component, sensor head component, sensor management component, light source component, converter component, rotator component, sensing fiber component, quarter waveplate fiber component, mirror component, etc.), as described with regard to a particular system or method, can include the same or similar functionality as respective components (e.g., respectively named components or similarly named components) as described with regard to other systems or methods disclosed herein.

Also, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

What has been described above includes examples of systems and methods that provide advantages of the disclosed subject matter. It is, of course, not possible to describe every conceivable combination of components or methods for purposes of describing the claimed subject matter, but one of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:
1. A system, comprising:
a first depolarizer component that is associated with a first portion of an optical cable that is in proximity to a light source component that provides a light signal to the optical cable, wherein the first depolarizer component depolarizes the light signal to generate a first depolarized light signal that is transmitted via a second portion of the optical cable, and wherein, during the transmission of the first depolarized light signal via the second portion of the optical cable, the first depolarized light signal is polarized to generate a modified light signal;
a second depolarizer component that is associated with a third portion of the optical cable in proximity to a sensor head component of a sensor component, wherein the second depolarizer component receives the modified light signal from the second portion of the optical cable and depolarizes the modified light signal to generate a second depolarized light signal;
a temperature sensor component that senses a temperature in an area that is in proximity to the light source component; and
a sensor management component that modifies sensor data or a parameter associated with the sensor component, based on the temperature, to mitigate a first amount of error in the sensor data resulting from the temperature in the area, wherein the sensor data relates to an electrical current or a voltage.

2. The system of claim 1, wherein the first depolarizer component and the second depolarizer component are Lyot or Lyot-type depolarizer components.

3. The system of claim 1, wherein the optical cable is a fiber optic cable, and wherein the first depolarizer component and the second depolarizer component are fiber-optic or bulk-optic, Lyot or Lyot-type depolarizer components.

4. The system of claim 1, wherein the sensor component is a polarimetric sensor component that senses or measures the electrical current or the voltage.

5. The system of claim 1, wherein the sensor component comprises a fiber sensor that measures voltage using a polarimetric or interferometric element.

6. The system of claim 1, wherein the second portion of the optical cable is situated between the first portion of the optical cable and the third portion of the optical cable, and wherein the second portion of the optical cable is associated with an electrical conductor cable or a ground wire.

7. The system of claim 6, wherein the second portion of the optical cable is wrapped around the electrical conductor cable or the ground wire.

8. The system of claim 6, wherein the second depolarizer component operates to reduce polarization in the second portion of the optical cable to mitigate a second amount of error in a measurement of the electrical current by the sensor component by reducing at least one of a Faraday effect, an optical effect, or a vibrational effect, associated with at least one of the second portion of the optical wire, the electrical conductor wire, or the ground wire, wherein the Faraday effect or the optical effect is based on the second portion of the optical cable being associated with the electrical conductor cable that is carrying the electrical current, and wherein the vibrational effect is based on a vibration of at least one of the second portion of the optical cable, the electrical conductor cable, or the ground wire.

9. The system of claim 6, wherein at least part of the second portion of the optical cable is located underground.

10. The system of claim 6, further comprising a chassis component that comprises the light source component and a subset of other components of the sensor component, wherein the first depolarizer component reduces a first amount of polarization of the light signal that is associated with the chassis component, and wherein the second depolarizer component reduces a second amount of polarization of the modified light signal that occurs due to a polarization dependent loss effect associated with at least one of the second portion of the optical cable, the electrical conductor cable, or the ground wire.

11. The system of claim 1, further comprising:
a rotator component that receives the second depolarized light signal from the second depolarizer component, polarizes and applies a phase shift to the second depolarized light signal, based on a defined polarization factor and a defined phase shift factor, to generate a polarized light signal;

a quarter waveplate fiber component that modifies the polarized light signal to a circular polarization state, wherein the quarter waveplate fiber component is part of the sensor head component;
a sensing fiber component that senses an electrical current associated with an electrical component or an electrical system, based on the polarized light signal in the circular polarization state, and, based on the sensing, generates a processed light signal that indicates an amount of the electrical current; and
a mirror component that redirects the processed light signal, via an output optical cable, to a photodetector component of the sensor component to facilitate detection and a determination of the amount of the electrical current based on the processed light signal.

12. A method, comprising:
first depolarizing, by a first depolarizer, a light signal to produce a first depolarized light signal, wherein the first depolarizer is associated with a first portion of a fiber optic cable that is within a first distance of a light source device that generates the light signal;
transmitting the first depolarized light signal via a second portion of the fiber optic cable, wherein the first depolarized light signal is polarized, based on at least one polarizing effect associated with the second portion of the fiber optic cable, to produce an altered light signal;
second depolarizing, by a second depolarizer, the altered light signal to produce a second depolarized light signal, wherein the second depolarizer receives the altered light signal and is associated with a third portion of the fiber optic cable that is within a second distance of a sensor head unit of a sensor device;
sensing, by a temperature sensor component, a temperature in an area that is in proximity to the light source device; and
modifying, by a sensor management component, sensor data or a parameter associated with the sensor component, based on the temperature, to mitigate a first amount of error in the sensor data resulting from the temperature in the area, wherein the sensor data relates to an electrical current or a voltage.

13. The method of claim 12, wherein the first depolarizer and the second depolarizer are fiber-optic or bulk-optic, Lyot or Lyot-type depolarizers.

14. The method of claim 12, further comprising:
associating the first depolarizer with at least the first portion of the fiber optic cable; and
associating the second depolarizer with at least one of the second portion of the fiber optic cable or the third portion of the fiber optic cable.

15. The method of claim 12, further comprising:
sensing, using the sensor device, the electrical current or the voltage of an electrical component or an electrical system, wherein the sensor device is a polarimetric sensor device.

16. The method of claim 12, wherein the second portion of the fiber optic cable is wrapped around or attached to an electrical conductor wire or a ground wire.

17. The method of claim 16, wherein the second depolarizer operates to reduce polarization in the second portion of the fiber optic cable to reduce a second amount of error in a measurement of the electrical current by the sensor device by reducing at least one of a Faraday effect, an optical effect, or a vibrational effect, associated with at least one of the second portion of the fiber optic cable, the electrical conductor wire, or the ground wire, wherein the Faraday effect or the optical effect is based on the second portion of the fiber optic cable being associated with the electrical conductor wire that is carrying the electrical current, and wherein the vibrational effect is based on a vibration of at least one of the second portion of the fiber optic cable, the electrical conductor wire, or the ground wire.

18. A device, comprising:
a first depolarizer component that is associated with a first portion of a fiber optic cable that is within a first distance of a light source component that emits a light signal to the first portion of the fiber optic cable, wherein the first depolarizer component depolarizes the light signal to produce a first depolarized light signal that is transmitted via a second portion of the fiber optic cable, and wherein, during the transmission of the first depolarized light signal via the second portion of the fiber optic cable, the first depolarized light signal is polarized, based on at least one polarizing effect associated with the second portion of the fiber optic cable, to produce an altered light signal;
a second depolarizer component that is associated with a third portion of the fiber optic cable that is within a second distance of a sensor head unit of a sensor component, wherein the second depolarizer component receives the altered light signal from the second portion of the fiber optic cable and depolarizes the altered light signal to produce a second depolarized light signal;
a temperature sensor component that senses a temperature in an area that is in proximity to the light source component; and
a sensor management component that modifies sensor data or a parameter associated with the sensor component, based on the temperature, to mitigate a first amount of error in the sensor data resulting from the temperature in the area, wherein the sensor data relates to an electrical current or a voltage.

19. The device of claim 18, wherein the first depolarizer component and the second depolarizer component are fiber-optic or bulk-optic, Lyot or Lyot-type depolarizer components.

* * * * *